United States Patent
Lin et al.

(10) Patent No.: US 11,144,145 B2
(45) Date of Patent: *Oct. 12, 2021

(54) TOUCH DISPLAY DEVICE

(71) Applicant: Innolux Corporation, Miao-Li County (TW)

(72) Inventors: Hsiao-Lang Lin, Miao-Li County (TW); Jui-Jen Yueh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/795,543

(22) Filed: Feb. 19, 2020

(65) Prior Publication Data

US 2020/0192512 A1 Jun. 18, 2020

Related U.S. Application Data

(63) Continuation of application No. 15/846,239, filed on Dec. 19, 2017, now Pat. No. 10,606,391.

(30) Foreign Application Priority Data

Jan. 11, 2017 (CN) .......................... 201710019694.7

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC ................... G06F 3/0412; G06F 3/044; G06F 2203/04111; G06F 3/0416; H01L 25/167; H01L 27/323; H01L 51/5253; H01L 27/1251; H01L 27/124; H01L 27/3276; H01L 33/52
See application file for complete search history.

(56) References Cited

U.S. PATENT DOCUMENTS 9,535,522 B2 * 1/2017 Ahn ..................... G09G 3/3208
9,600,127 B2 * 3/2017 Hong .................... G06F 3/0412
(Continued)

*Primary Examiner* — Michael J Jansen, II
(74) *Attorney, Agent, or Firm* — JCIPRNET

(57) ABSTRACT

The present disclosure provides a touch display device including a substrate, a light-emitting component, a first insulating layer, a touch part, a first transmission part, a first conductive connection structure and a second transmission part. The light-emitting component is disposed above the substrate. The first insulating layer is disposed above the light-emitting component. The touch part is disposed above the first insulating layer. The first transmission part is disposed above the substrate, wherein the first transmission part is electrically connected to the touch part. The first conductive connection structure penetrates through the first insulating layer. The second transmission part is disposed below the first transmission part, wherein the first transmission part is electrically connected to the second transmission part via the first conductive connection structure.

9 Claims, 26 Drawing Sheets

(52) U.S. Cl.
CPC ........ *G06F 3/04164* (2019.05); *H01L 27/323* (2013.01); *G06F 2203/04103* (2013.01); *H01L 27/3276* (2013.01)

(56) References Cited

U.S. PATENT DOCUMENTS

| | | | | |
|---|---|---|---|---|
| 9,626,019 | B2* | 4/2017 | Lee | G06F 3/041 |
| 9,772,727 | B2* | 9/2017 | Kim | G06F 3/0445 |
| 9,823,792 | B2* | 11/2017 | Park | G06F 3/04164 |
| 9,891,735 | B2* | 2/2018 | Bae | G06F 3/04166 |
| 9,891,769 | B2* | 2/2018 | Han | H05K 1/0296 |
| 9,933,886 | B2* | 4/2018 | Kim | G06F 3/0446 |
| 10,056,422 | B2* | 8/2018 | Wan | H01L 25/043 |
| 10,162,440 | B2* | 12/2018 | Jin | G02F 1/1345 |
| 10,347,699 | B2* | 7/2019 | Kwon | G06F 3/0412 |
| 10,430,000 | B2* | 10/2019 | Wu | H01L 51/0097 |
| 10,459,272 | B2* | 10/2019 | Song | H01L 27/1259 |
| 10,504,981 | B2* | 12/2019 | Ma | H01L 51/5237 |
| 10,606,391 | B2* | 3/2020 | Lin | G06F 3/04164 |
| 10,627,939 | B2* | 4/2020 | Oh | H01L 27/323 |
| 10,866,663 | B2* | 12/2020 | Jun | G06F 3/04164 |
| 2013/0016047 | A1* | 1/2013 | Masumoto | G06F 3/0445 345/173 |
| 2014/0022476 | A1* | 1/2014 | Park | G02F 1/1362 349/41 |
| 2015/0085204 | A1* | 3/2015 | Lee | G06F 3/041 349/12 |
| 2015/0130760 | A1* | 5/2015 | Kim | G06F 3/0445 345/174 |
| 2015/0138146 | A1* | 5/2015 | Hong | G06F 3/0446 345/174 |
| 2015/0169109 | A1* | 6/2015 | Park | G06F 3/0446 345/174 |
| 2016/0116794 | A1* | 4/2016 | Song | H01L 27/1259 349/43 |
| 2016/0147336 | A1* | 5/2016 | Han | H05K 3/28 345/174 |
| 2016/0154499 | A1* | 6/2016 | Bae | G06F 3/04166 345/174 |
| 2016/0179229 | A1* | 6/2016 | Ahn | G06F 3/04164 345/173 |
| 2016/0202831 | A1* | 7/2016 | Kim | G06F 3/0443 345/173 |
| 2016/0218151 | A1* | 7/2016 | Kwon | H01L 27/3276 |
| 2016/0328062 | A1* | 11/2016 | Jin | G06F 3/0412 |
| 2017/0192566 | A1* | 7/2017 | Ma | H01L 51/5237 |
| 2017/0373113 | A1* | 12/2017 | Wan | H01L 27/14629 |
| 2018/0033830 | A1* | 2/2018 | Kim | G06F 3/0443 |
| 2018/0039352 | A1* | 2/2018 | Wu | H01L 27/323 |
| 2018/0150170 | A1* | 5/2018 | Oh | H01L 27/323 |
| 2018/0164933 | A1* | 6/2018 | Jun | G09G 3/3258 |
| 2018/0196564 | A1* | 7/2018 | Lin | G06F 3/0443 |
| 2020/0192512 | A1* | 6/2020 | Lin | H01L 25/167 |

* cited by examiner

TOUCH DISPLAY DEVICE

CROSS-REFERENCE TO RELATED APPLICATION

This application is a continuation application of and claims the priority benefit of a prior application Ser. No. 15/846,239, filed on Dec. 19, 2017, now allowed. The prior application Ser. No. 15/846,239 claims the priority benefit of China application serial no. 201710019694.7, filed on Jan. 11, 2017. The entirety of each of the above-mentioned patent applications is hereby incorporated by reference herein and made a part of this specification.

BACKGROUND OF THE INVENTION

1. Field of the Invention

The present embodiment relates to a touch display device, and in particular to a touch display device comprising a light-emitting component.

2. Description of Related Art

In recent years, with the rapid development of various applications such as information technology, wireless mobile communication and information appliances, in order to achieve more convenience, smaller volume and more user friendliness, the input devices of a lot of information products have been changed from traditional keyboards, mouses, and the like into touch display devices. A common touch display device can realize integration of a touch function and a display function by respectively manufacturing a display panel and a touch panel, and then fitting or assembling the display panel and the touch panel together. However, the volume of a touch display device manufactured in this way cannot be reduced, with the result that the device does not meet the need of the market of electronic products. Hence, technologies for integrating a touch component on a display panel have already been presented.

SUMMARY OF THE INVENTION

According to some embodiments, a touch display device comprises a substrate, a light-emitting component, a first insulating layer, a touch part, a first transmission part, a first conductive connection structure and a second transmission part. The substrate includes a display area and a peripheral area. The light-emitting component is disposed above the substrate and within the display area. The first insulating layer is disposed above the light-emitting component and within the display area and the peripheral area. The touch part is disposed above the first insulating layer and within the display area. The first transmission part is disposed above the substrate and within the peripheral area, wherein the first transmission part is electrically connected to the touch part. The first conductive connection structure penetrates through the first insulating layer. The second transmission part is disposed below the first transmission part and within the peripheral area, wherein the first transmission part is electrically connected to the second transmission part via the first conductive connection structure.

Based on the foregoing, in the touch display device of the embodiments of the present disclosure, the touch part and the light-emitting component are disposed on the same substrate, thus achieving integration of touch function and display function.

BRIEF DESCRIPTION OF THE DRAWINGS

The accompanying drawings are included to provide a further understanding of the present disclosure, and are incorporated in and constitute a part of this specification. The accompanying drawings illustrate embodiments of the present disclosure and, together with the description, serve to explain the principles of the present disclosure.

DESCRIPTION OF THE EMBODIMENTS

Figure 1A:
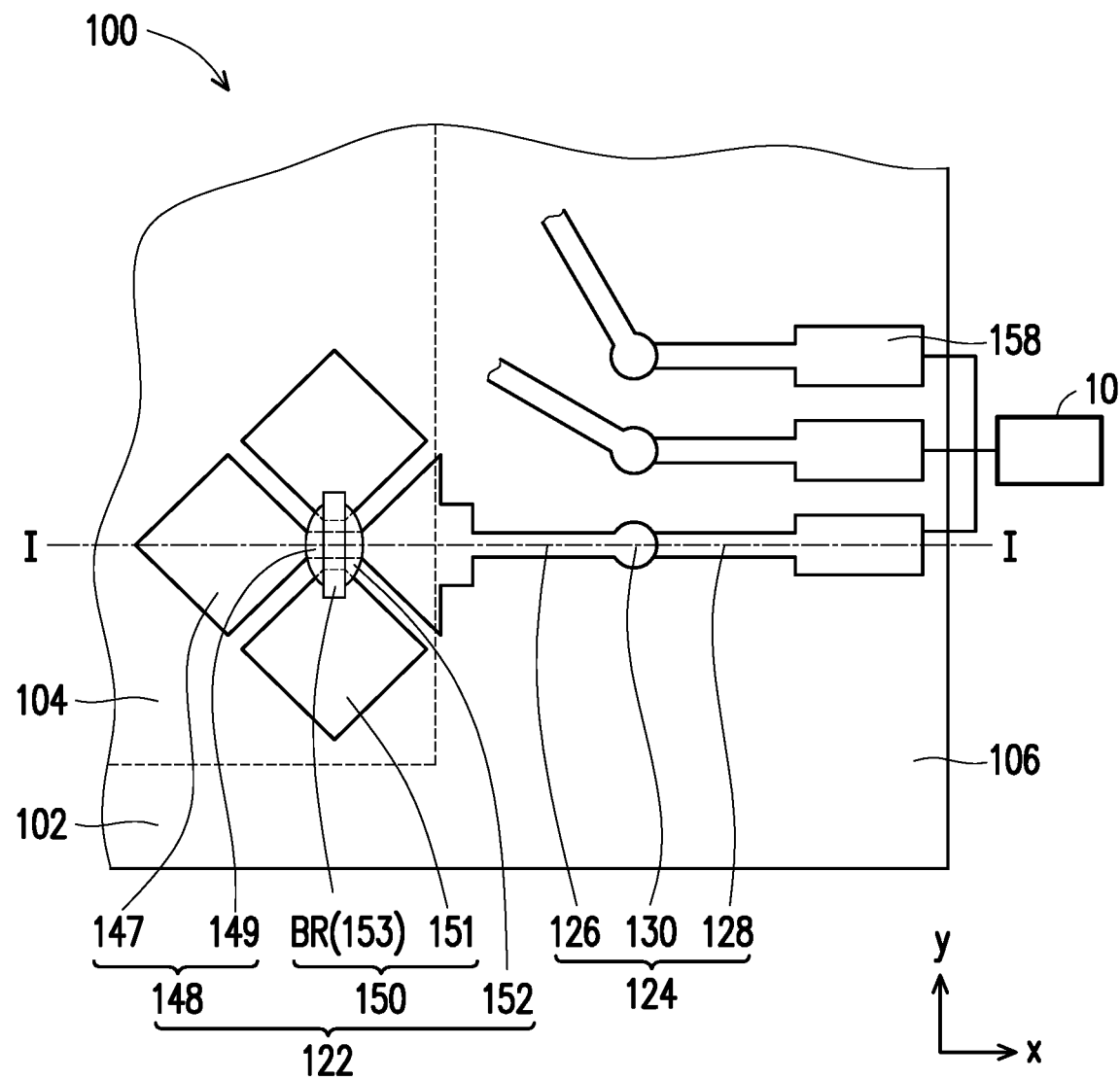
FIG. 1A is a schematic diagram showing a local top view of a touch display device according to a first embodiment of the present disclosure.

Reference will now be made in detail to the exemplary embodiments of the present disclosure, examples of which are illustrated in the accompanying drawings. Wherever possible, the same reference numbers are used in the drawings and the descriptions to refer to the same or like parts. In addition, the embodiments can be mutually combined, and descriptions of the same or like concepts or processes are omitted in some embodiments.

In the disclosure of the present embodiment, the locution "an element A being located on an element B", used to describe a positional relationship, encompasses the possibilities of one or multiple other elements disposed between the element A and the element B, as well as the case of no other elements existing between the element A and the element B.

Figure 1B:
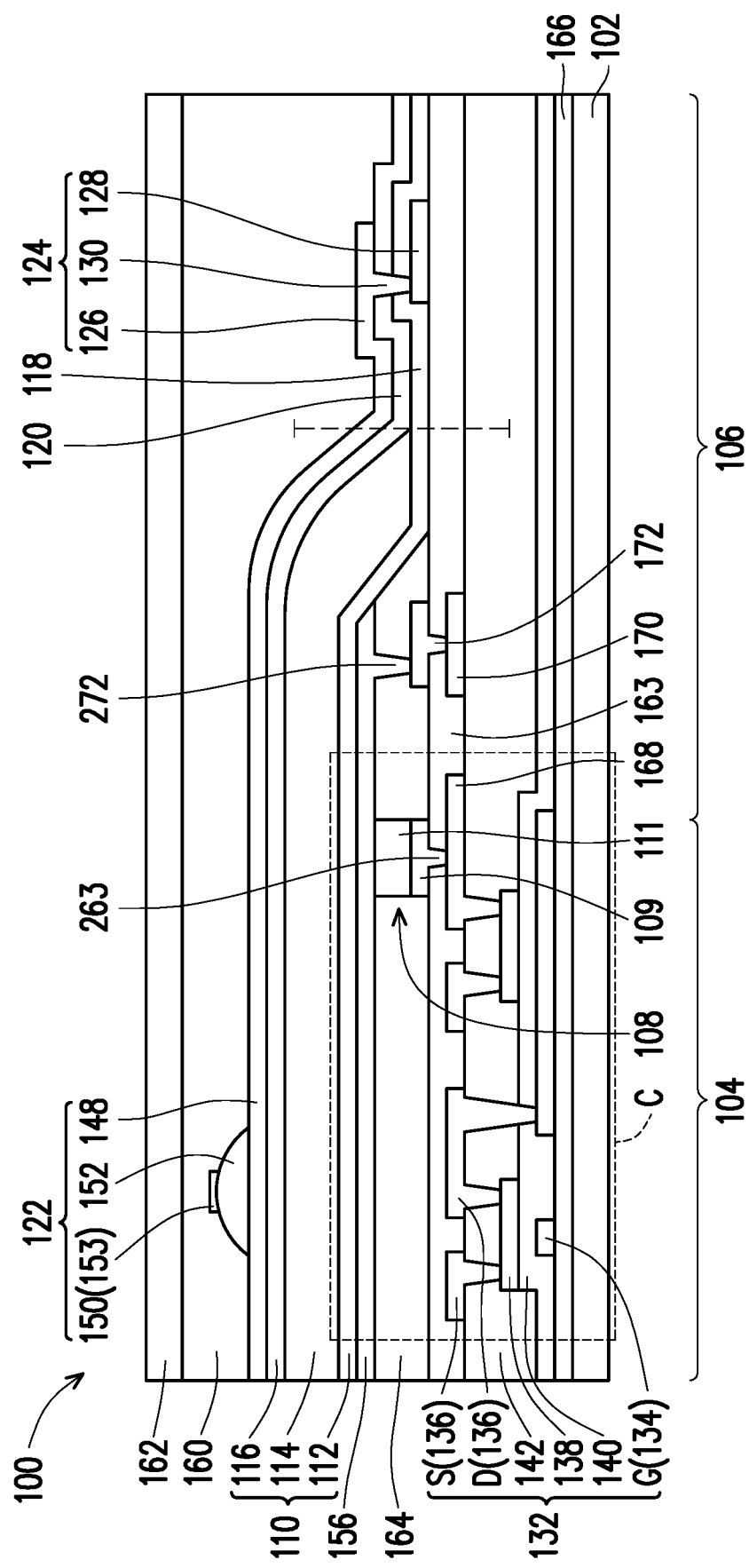
FIG. 1B is a schematic diagram showing a cross-section of the touch display device of FIG. 1A taken along a line I-I.

FIG. 1A is a schematic diagram showing a local top view of a touch display device according to a first embodiment of the present disclosure. FIG. 1B is a schematic diagram showing a cross-section of the touch display device of FIG. 1A taken along a line I-I.

Referring to FIG. 1A and FIG. 1B at the same time, a touch display device 100 includes a substrate 102, a light-emitting component 108, a first insulating layer 110, a touch component 122 including a first touch part 148, and a touch signal transmission line 124 comprising a first transmission part 126. In the present embodiment, the border of a light-emitting area of the light-emitting component 108 located closest to the edge of the substrate 102 can serve as a boundary between a display area 104 and a peripheral area 106 of the substrate 102. The substrate 102 can be a flexible substrate or a rigid substrate. The material of the flexible substrate may include, but is not limited to, plastic or glass. The material of the rigid substrate may include, but is not limited to, glass or silicon wafer. The light-emitting component 108 is disposed on the display area 104. The first insulating layer 110 is disposed on the display area 104 and the peripheral area 106, and covers the light-emitting component 108. The first touch part 148 is disposed on the first insulating layer 110, and at least a portion of the first touch part 148 is located on the display area 104. The first transmission part 126 is disposed on the first insulating layer 110 and is disposed on the peripheral area 106. The first transmission part 126 is electrically connected with the first touch part 148, so as to transmit a signal of the first touch part 148 to an external device, e.g., a processing unit 10. As shown in FIG. 1A, the first transmission part 126 can be electrically connected with the processing unit 10 via a bonding part 158 for transmitting signals. For example, the processing unit 10 can be an integrated circuit. According to some embodiments, the first transmission part 126 and the first touch part 148 may be made of the same material. For example, the first transmission part 126 and the first touch part 148 can be formed in the same process, i.e., formed by patterning the same raw material layer. For example, the first transmission part 126 and the first touch part 148 can be of the same layer.

The touch display device 100 can also include an active device array, disposed in the display area 104 of the substrate 102. The touch display device 100 can also include a second insulating layer 163 disposed between the active device array and the light-emitting component 108 to separate the active device array from the light-emitting component 108. The active device array may include, but is not limited to, at least one thin film transistor 132. An embodiment of the active device array may include other components except the thin film transistor 132, such as capacitors and transmission lines. In the present embodiment, the thin film transistor 132 is a component formed by a semiconductor layer 138, a gate G, a source S and a drain D. The gate G overlaps the channel area (not shown) of the semiconductor layer 138, and the source S and the drain D contact different portions of the channel area of the semiconductor layer 138. The gate G is formed by a first conducting layer 134, and the source S and the drain D are formed by a second conducting layer 136. The first conducting layer 134 is located between the second conducting layer 136 and the substrate 102. The second insulating layer 163 is disposed between the thin film transistor 132 and the light-emitting component 108. Specifically, the second insulating layer 163 is disposed between the first conducting layer 134 of the thin film transistor 132 and the light-emitting component 108, and is disposed between the second conducting layer 136 of the thin film transistor 132 and the light-emitting component 108.

FIG. 1B exemplarily shows that the thin film transistor 132 is a thin film transistor with a bottom gate structure (i.e., the gate G is located between the semiconductor layer 138 and the substrate 102). However, the semiconductor layer 138 may be located between the gate G and the substrate 102 in an alternative embodiment, thus forming a thin film transistor with a top gate structure. The material of the first conducting layer 134 or the second conducting layer 136 may be any known metal material suitable for manufacturing the active device array or a proper conducting material, and the descriptions thereof are omitted herein. It can be understood that the active device array includes at least one metal component such as the gate or the source and the drain. Besides, in the thin film transistor 132, different metal components may be separated by one or multiple dielectric layers, such as a first dielectric layer 140 and a second dielectric layer 142 as shown in FIG. 1B. The first dielectric layer 140 is located between the first conducting layer 134 and the semiconductor layer 138, and the second dielectric layer 142 is located between the second conducting layer 136 and the semiconductor layer 138.

The light-emitting component 108 is disposed on the second insulating layer 163 that covers the active device array. In the present embodiment, the area of the light-emitting component 108 can be defined by a pixel definition layer 164. The light-emitting component 108 includes a first electrode 109, an opposite electrode 156, and a light-emitting layer 111. The light-emitting layer 111 is disposed between the opposite electrode 156 and the first electrode 109. The light-emitting component 108 may be driven by the active device array. Taking FIG. 1B as an example, the second conducting layer 136 in the active device array may also include an electrode 168 used as connection to the first electrode 109, and hence the first electrode 109 may be electrically connected with the electrode 168 by a conductive connection structure 263 penetrating through the second insulating layer 163. The first electrode 109, for example, may be an anode, and the opposite electrode 156, for example, may be a cathode. Alternatively, the first electrode 109 may be a cathode, and the opposite electrode 156 may be an anode. The light-emitting component 108, for example, may be an organic light-emitting diode (OLED), a micro light-emitting diode (micro-LED) or the like, but is not limited thereto.

In the present embodiment, the touch display device 100 may also include an opposite electrode wire 170, which, for example, can be formed by the second conducting layer 136, but is not limited thereto. Taking FIG. 1B as an example, the opposite electrode 156 may be connected to the opposite electrode wire 170 formed by the second conducting layer 136 through, for example, a conductive connection structure 272 and a conductive connection structure 172. The conductive connection structure 272 is located in the pixel definition layer 164, and the conductive connection structure 172 is located in the second insulating layer 163.

The first insulating layer 110 covers the light-emitting component 108 and the active device array, and may be configured for blocking water and oxygen to protect the light-emitting component. The first insulating layer 110 may be formed in such a way that inorganic materials and/or organic materials are alternately stacked to form a multi-layer structure. The inorganic material includes, but is not limited to, $Al_2O_3$, $SiN_x$ or $SiO_x$. The organic material includes, but is not limited to, an acrylic base material or a parylene base material. As long as the water and oxygen blocking effect of the first insulating layer 110 may be retained, the stacking sequence and the number of layers of the inorganic material and the organic material are not specially limited. In the present embodiment, the first insulating layer 110 may include a first inorganic layer 112 and a second inorganic layer 116 disposed on the first inorganic layer 112, but is not limited thereto. In the display area 104 of the touch display device 100, the first insulating layer 110 may further include an organic layer 114, located between the first inorganic layer 112 and the second inorganic layer 116. That is, the first inorganic layer 112 and the second inorganic layer 116 are in direct contact with each other at the peripheral area 106, and are respectively located on the upper and lower sides of the organic layer 114 in the display area 104. Generally speaking, the organic layer 114 is relatively thick, and by arranging the edge of the organic layer 114 into a gentle slope structure, the wire breakage phenomenon of a subsequent layer at the edge of the organic layer 114 may be effectively reduced.

The touch display device 100 may also include a second touch part 150 and a third insulating layer 152. Particularly, as shown in FIG. 1A, the first touch part 148, the second touch part 150, and the third insulating layer 152 may form the touch component 122. Similar to the above-mentioned first touch part 148, the second touch part 150 may also be electrically connected with the processing unit 10 for transmitting signals. The second touch part 150 may be electrically connected with the processing unit 10 in a similar manner to that of the first touch part 148, e.g. through a touch signal transmission line including a transmission part, and the descriptions thereof are omitted herein.

In the present embodiment, the touch display device may be a mutual-capacitance type, the first touch part 148 may be a driving electrode for receiving a driving signal, and the second touch part 150 may be a sensing electrode that passes a sensing signal back to the processing unit. Alternatively, the first touch part 148 may be a sensing electrode, and the second touch part 150 may be a driving electrode. In other embodiments, the touch type of the touch display device may also be of the self-capacitance type.

The first touch part 148 may include multiple first touch electrodes 147 and multiple first connecting parts 149. The multiple first touch electrodes 147 are arranged along a first direction x, and are electrically connected with one another by the multiple first connecting parts 149. The second touch part 150 includes multiple second touch electrodes 151 and multiple second connecting parts 153. The multiple second touch electrodes 151 are arranged along a second direction y different from the first direction x (the first direction x and the second direction y, for example, are orthogonal to each other, but may also intersect each other in a non-orthogonal way). The multiple second touch electrodes 151 are electrically connected with one another by the multiple second connecting parts 153 (namely bridge BR). At least one of the multiple first connecting parts 149 crosses at least one of the multiple second connecting parts 153. In FIG. 1A, for illustration, only one first connecting part 149 and only one second connecting part 153 are shown, and the first connecting part 149 crosses the second connecting part 153. Other first connecting parts 149 and other second connecting parts 153, which are not shown, may also cross each other. The third insulating layer 152 is disposed between the multiple first connecting parts 149 and the multiple second connecting parts 153, so that the multiple first connecting parts 149 and the multiple second connecting parts 153 are electrically insulated from each other. According to some embodiments, the third insulating layer 152 may include multiple island-like insulating structures, and each island-like insulating structure is located between the corresponding first connecting part 149 and second connecting part 153. For illustration, only one island-like insulating structure is shown in FIG. 1A and FIG. 1B. The material of the first touch electrodes 147 and the second touch electrodes 151 may be a transparent conducting material, a metal mesh, silver nanowires or carbon nanotubes. The transparent conducting material includes, but is not limited to, ITO (indium tin oxide) or conductive polymers.

For illustration, only one touch part 148 and one second touch part 150 are shown in FIG. 1A. A person skilled in the art can know that the touch display device 100 may include multiple first touch parts 148 and multiple second touch parts 150. The multiple first touch parts 148 may be disposed in parallel, each one extending along the first direction x; the multiple second touch parts 150 can also be disposed in parallel, each extending along the second direction y, and the descriptions thereof are omitted herein.

In a first embodiment of the present disclosure, as shown in FIG. 1B, a top bridge structure is exemplarily shown, i.e., the second connecting parts 153 are located above the first touch part 148. Moreover, the first connecting parts 149 and the first touch electrodes 147 may be made of the same material or different materials, and the second connecting parts 153 and the second touch electrodes 151 may be made of the same material or different materials. For example, according to some embodiments, the first touch electrodes 147, the first connecting parts 149, and the second touch electrodes 151 may be made of the same material and formed by the same manufacture process, and, for example, may be made of a transparent conducting material. The second connecting parts 153 may be made of metal and formed by another process, but are not limited thereto. In other embodiments, the touch component 122 can include only one conducting material layer, that is, one layer solution. For example, the touch component 122 can be mutual capacitance sensing type with a single touch layer, or is a self-capacitance sensing type with a single touch layer.

In the present embodiment, the touch signal transmission line 124 may include a first transmission part 126, a first conductive connection structure 130 and a second transmission part 128. The first conductive connection structure 130 can penetrate through the first insulating layer 110. According to some embodiments, the first transmission part 126 may be made of the same material as the first conductive connection structure 130, and may also be made of the same material as the first touch part 148. The second transmission part 128 and the first electrode 109 may be made of the same material, but are not limited thereto. For example, the first touch part 148, the first transmission part 126, and the first conductive connection structure 130 may be formed simultaneously by using the same material with the same manufacture procedure. Namely, the first touch part 148, the first transmission part 126, and the first conductive connection structure 130 may be formed simultaneously by patterning the same raw material layer. For example, the first touch part 148, the first transmission part 126, and the first conductive connection structure 130 may be of the same layer and made of the same material. According to some embodiments, the first transmission part 126 and the first conductive connection structure 130 may be made by different materials and be formed by different processes. For example, the first transmission part 126 may be made of a transparent conducting layer (such as ITO), and the first conductive connection structure 130 may be made of metal.

According to some embodiments, the second transmission part 128 and the first electrode 109 may be formed simultaneously in the same process. Namely, the second transmission part 128 and the first electrode 109 may be formed simultaneously by patterning the same raw material layer. For example, the second transmission part 128 and the first electrode 109 may be of the same layer. The first transmission part 126 is electrically connected to the first touch part 148. The first transmission part 126 is electrically connected with the second transmission part 128 via the first conductive connection structure 130. The touch signal transmission line 124 may also include the bonding part 158. As shown in FIG. 1A, the bonding part 158 is located at the end of the touch signal transmission line 124, so that the first transmission part 126, the second transmission part 128, and the bonding part 158 form a continuous transmission line. The bonding part 158 is located in the peripheral area 106 to be connected with an external processing unit 10. Therefore, the touch signal transmission line 124 may be used to connect the touch component 122 with the external processing unit 10 for transmitting a signal of the touch component 122 to the external component.

The touch display device 100 may include other layers or components such as a buffer layer 166, a covering layer 160, and a cover plate 162 that are exemplarily shown in FIG. 1B. The active device array, the light-emitting component 108, the first insulating layer 110, the touch component 122, and the first transmission part 126 are located between the covering layer 160 and the substrate 102. The buffer layer 166 is located between the active device array and the substrate 102, and the covering layer 160 is located between the cover plate 162 and the touch component 122. But the present disclosure is not limited thereto, and any other layers or modules commonly used in the touch display device may be used for the present disclosure. These layers or components may be selectively disposed according to actual demands.

According to some embodiments, the first transmission part 126 and the first touch part 148 may be of the same layer, and may be formed by the same process. The second transmission part 128 and the first electrode 109 may be of the same layer (as shown in FIG. 1B), and may be formed by the same process. Thus, signal transmission of the touch component 122 can be realized without an additional metal trace fabrication. Consequently, the process of fabricating the touch display device may be simplified.

According to some embodiments, for example, when taking ITO as the material of the first transmission part 126, since the first transmission part 126 may be connected to the second transmission part 128 of a metal material via the first conductive connection structure 130. Thus, the overall impedance of the touch signal transmission line 124 may be decreased, the transmission and feedback of touch signals may be promoted, and touch efficacy may be effectively improved. According to some embodiments, the patterning process for forming the second transmission part 128 of the metal material is performed before the first insulating layer 110 is formed. Thus, possible damage to the first insulating layer 110 due to patterning of the second transmission part 128 may be avoided, and the water and oxygen blocking effect of the first insulating layer 110 may be retained. According to some embodiments, the first conductive connection structure 130 penetrates through an edge part 118 of the first inorganic layer 112 (the part extending outside the organic layer 114) and an edge part 120 of the second inorganic layer 116 (the part extending outside the organic layer 114), but does not penetrate through the organic layer 114, thus achieving sufficient protection against infiltrations of water and oxygen.

Figure 1C:
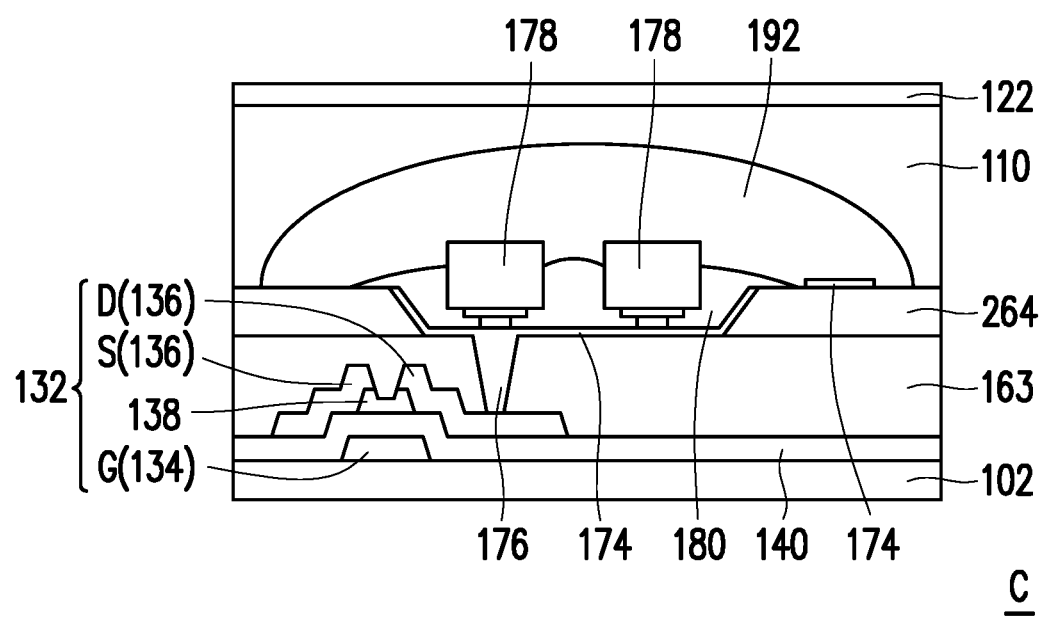
FIG. 1C is a schematic diagram showing an alternative example of the cross-section of the touch display device in FIG. 1A, wherein micro light-emitting diodes serve as a light-emitting component in a dotted frame C.

FIG. 1C is a schematic diagram of an alternative example of the touch display device, wherein micro light-emitting diodes serve as a light-emitting component 108 in a dotted frame C of FIG. 1B. As shown in FIG. 1C, each micro light-emitting diode 178 herein, for example, is a light-emitting diode chip of a micron level size. When the micro light-emitting diodes 178 serve as the light-emitting component, the thin film transistor 132 used to drive the micro light-emitting diodes 178 may include a gate G (for example, formed by a first metal layer 134), a semiconductor layer 138, a source S and a drain D (for example, the source and the drain are formed by a second metal layer 136). The semiconductor layer 138 and the gate G are separated from each other by a first dielectric layer 140, and the second insulating layer 163 covers the thin film transistor 132 and may serve as a planarization layer. In the present embodiment, a dielectric layer 264 is disposed on the second insulating layer 163, and the dielectric layer 264 is provided with an opening to define an arrangement space of the micro light-emitting diodes 178. Namely, the micro light-emitting diodes 178 may be disposed in the opening of the dielectric layer 264. A third metal layer 174 is disposed on the second insulating layer 163, and is located in the opening of the dielectric layer 264, and the micro light-emitting diodes 178 are bonded, for example, onto the third metal layer 174. The third metal layer 174 may be electrically connected with the drain D by a conductive connection structure 176 penetrating through the second insulating layer 163. Besides, an insulating material 180 is further disposed among the micro light-emitting diodes 178. An opposite conducting layer 192 is disposed on the micro light-emitting diodes 178. When the design of the present embodiment is applied to the touch display device in FIG. 1B, the first insulating layer 110 and the touch component 122, for example, are disposed on the opposite conducting layer 192, wherein the first insulating layer 110 and the touch component 122 are only schematically shown in FIG. 1C, and the detailed design of these components may refer to the content above. Besides, the first insulating layer 110 may be a single-layer type insulating layer, and may also be a multi-layer type insulating layer. In other words, the first insulating layer 110 does not need to be limited to adopting a structure with stacking of one organic layer and one inorganic layer, and the first insulating layer 110 may also be formed by a single inorganic layer or multiple inorganic layers.

Figure 2:
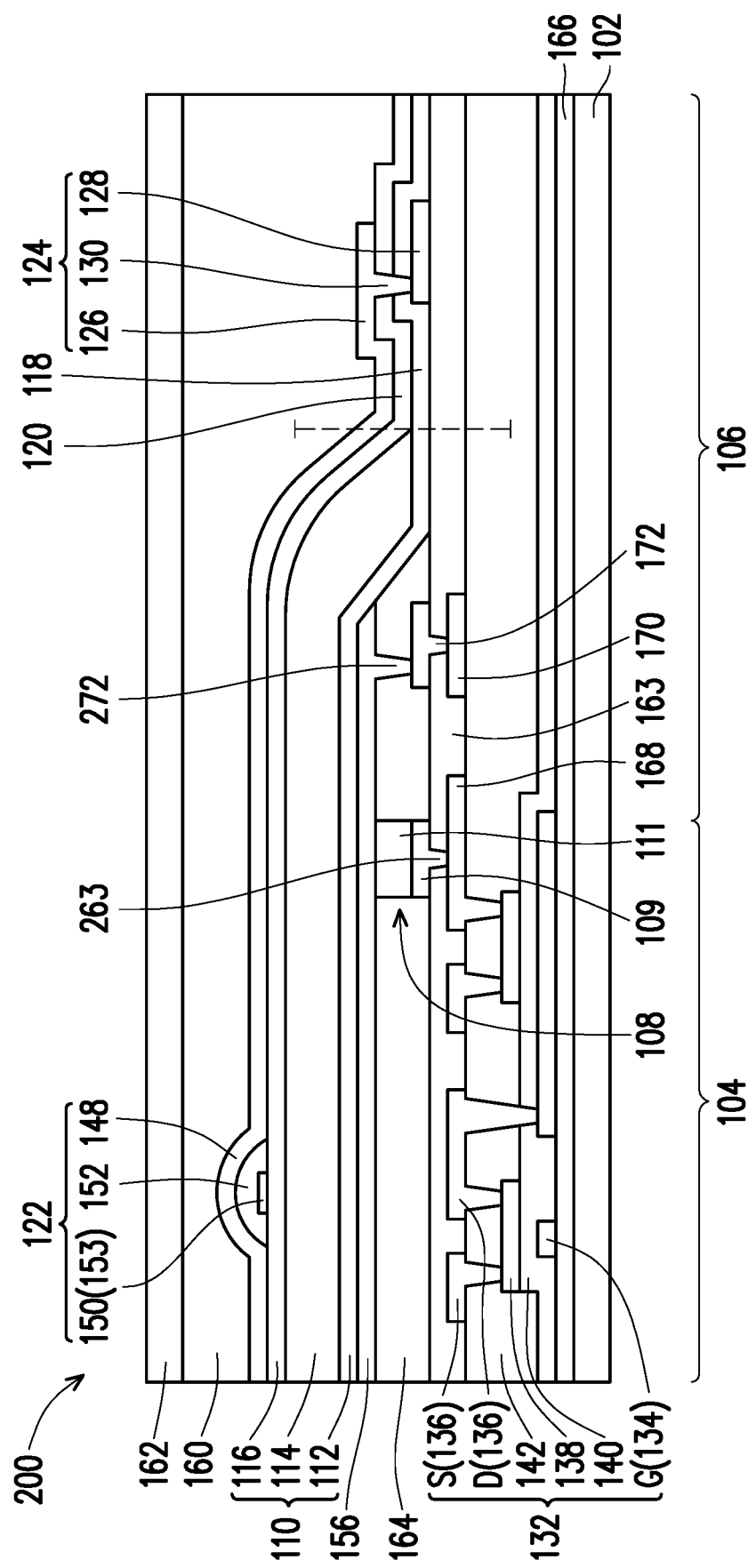
FIG. 2 is a schematic diagram showing a cross-section of an alternative example of the touch display device according to the first embodiment of the present disclosure.

FIG. 2 is a schematic diagram showing a cross-section of an alternative example of the touch display device according to the first embodiment of the present disclosure. A touch display device 200 is different from the touch display device 100 of the first embodiment of the present disclosure in that the touch component 122 is of a bottom bridge structure, i.e., the second connecting parts 153 are located below the first touch part 148, and are closer to the first insulating layer 110 relative to the first touch part 148. The remaining structures of the touch display device 200 may refer to the first embodiment above, and the descriptions thereof are omitted herein.

Figure 3A:
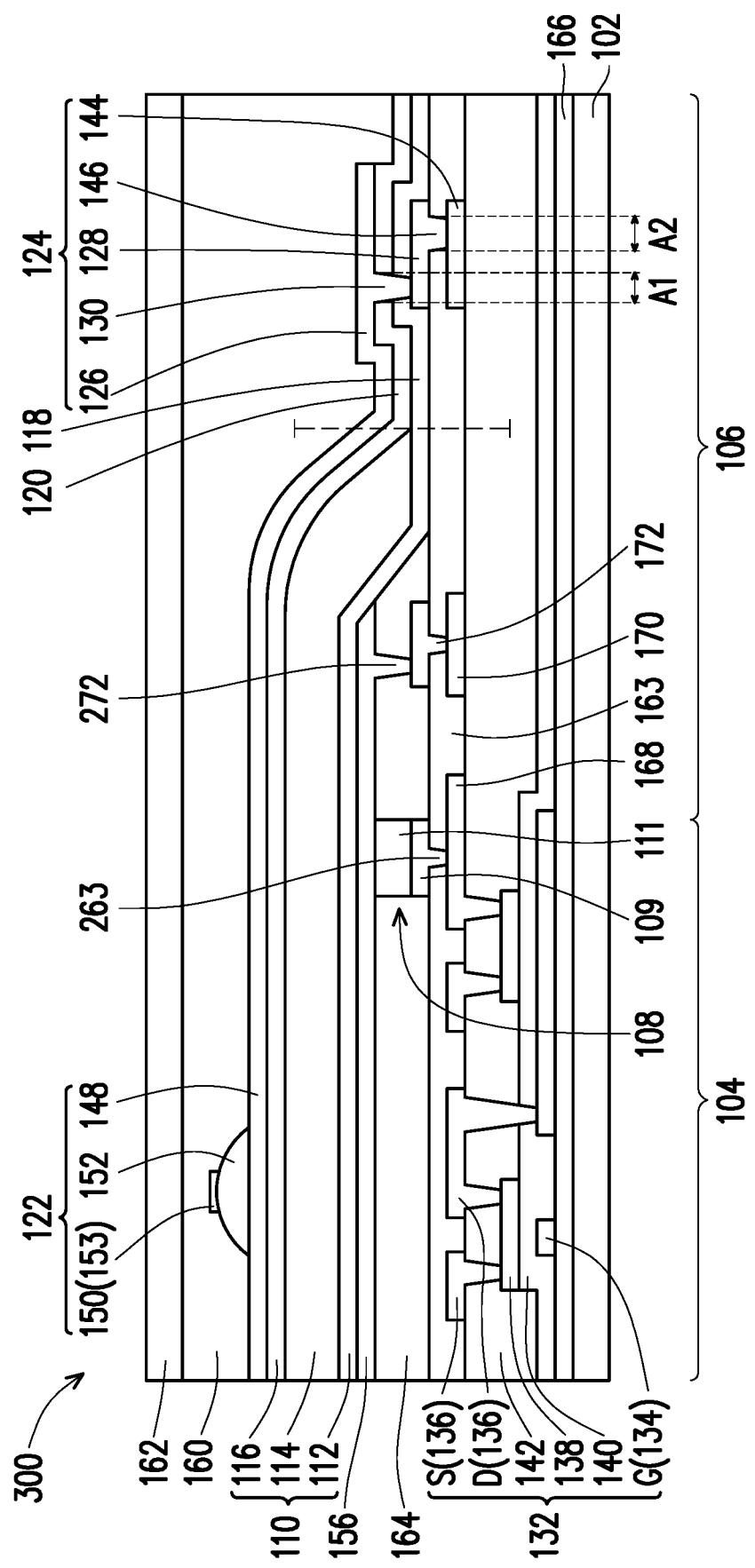
FIG. 3A, FIG. 3B and FIG. 3C are schematic diagrams showing the cross-sections of a touch display device according to a second embodiment of the present disclosure.

FIG. 3A is a schematic diagram showing a cross-section of a touch display device according to a second embodiment of the present disclosure. The basic structure of a touch display device 300 in FIG. 3A is the same as the basic structure of the touch display device 100 in FIG. 1B, and the detailed descriptions thereof may refer to the first embodiment above, unless otherwise stated. The touch display device 300 can further include a second conductive connection structure 146 penetrating through the second insulating layer 163 and a third transmission part 144. The third transmission part 144 and the second conducting layer 136 may be made of the same material, and the second transmission part 128 is electrically connected with the third transmission part 144 via the second conductive connection structure 146.

Figure 3B:
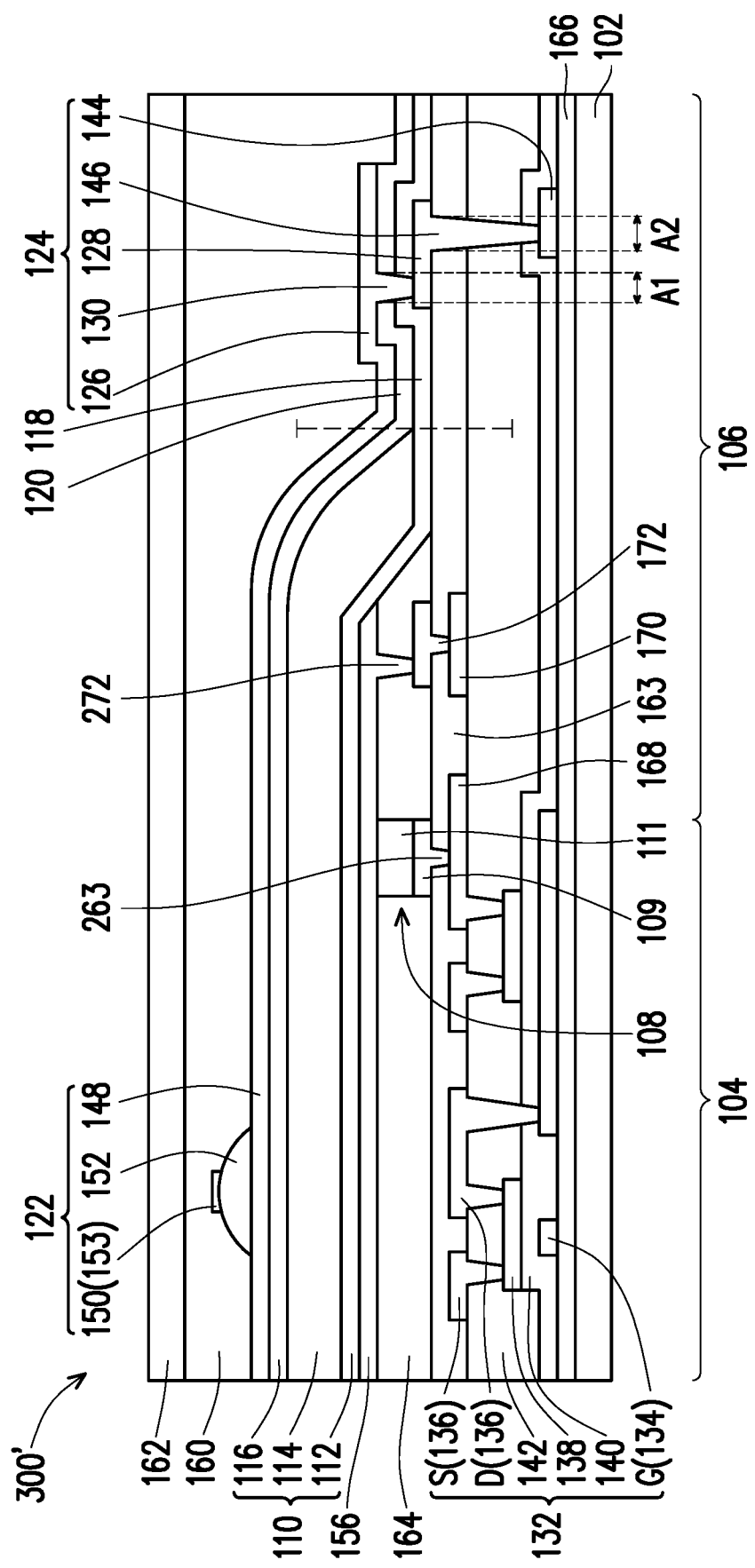
Figure 3C:
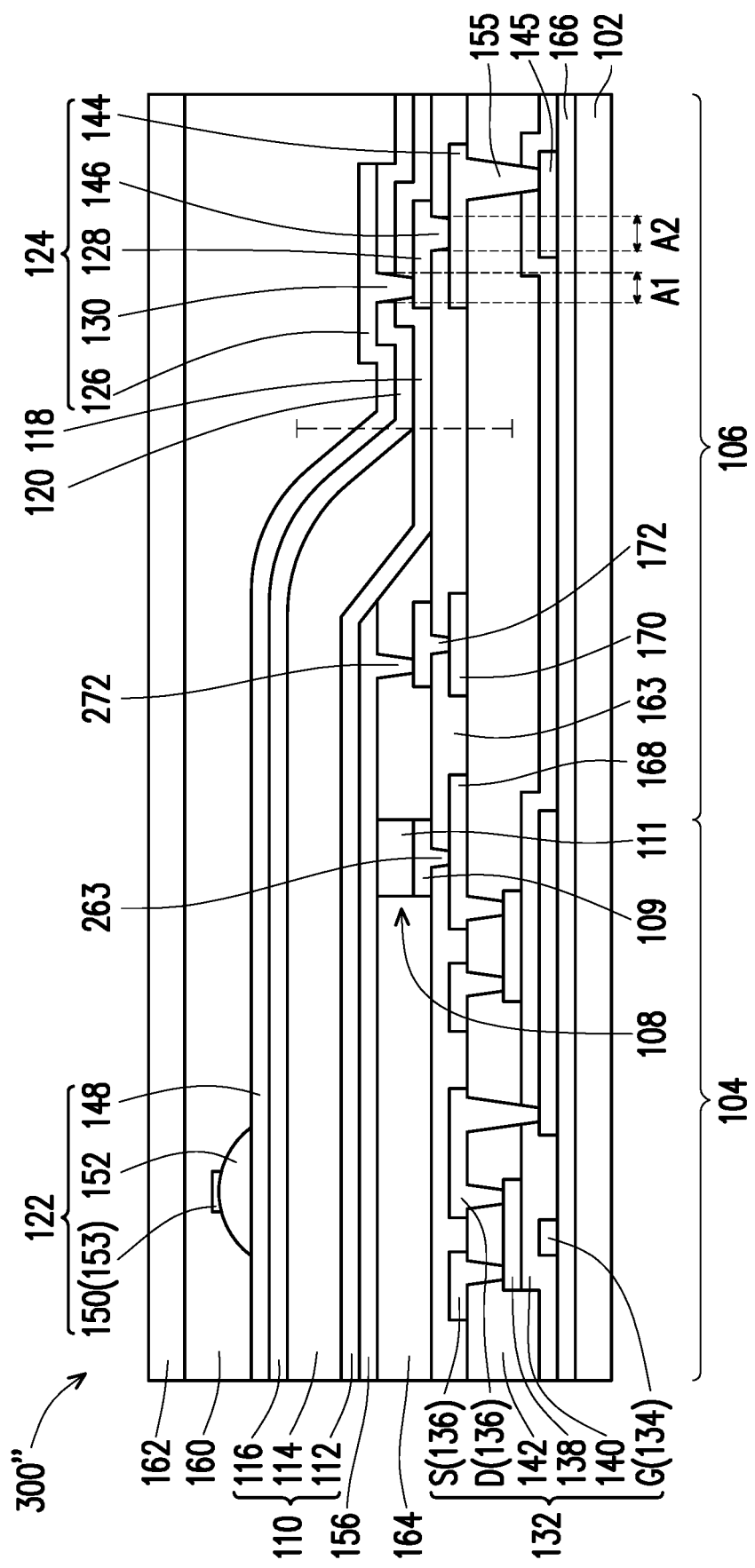

In the present embodiment, the third transmission part 144 is formed by the second conducting layer 136 forming the source S and the drain D, so that the third transmission part 144, the source S and the drain D may be fabricated in the same process, and may be of the same layer. Moreover, the second insulating layer 163 is penetrated through by the second conductive connection structure 146, so that the second transmission part 128 is connected to the third transmission part 144 by the second conductive connection structure 146. Besides, it can be known from FIG. 3A that an area A1 of the projection of the first conductive connection structure 130 on the substrate 102 and an area A2 of the projection of the second conductive connection structure 146 on the substrate 102 are separated from each other and do not overlap. Alternatively, in an embodiment in FIG. 3B, for example, the third transmission part 144 may be formed by using the first metal layer 134 forming the gate G, and the second conductive connection structure 146 penetrates through the second insulating layer 163 and also penetrates through the dielectric layers 140 and 142. Or, in another embodiment in FIG. 3C, for example, a fourth transmission part 145 may be formed by using the first metal layer 134 forming the gate G; a third conductive connection structure 155 penetrating through the dielectric layers 140 and 142 is disposed, and the third transmission part 144 formed by the second conducting layer 136 can be connected to the fourth transmission part 145 by the third conductive connection structure 155. That is, the touch signal transmission line 124 may include a transmission part formed by at least one of the first metal layer 134 and the second metal layer 136.

According to some embodiments, the second transmission part 128 and a first electrode 109 of a light-emitting component may be of the same layer, and the third transmission part 144 can be of same layer as the first or the second metal layer 134 or 136. In other embodiments, the third transmission part 144 and the second metal layer 136 may be of the same layer, and the fourth transmission part 145 and the first metal layer 134 may be of the same layer. Accordingly, signal transmission of the touch component 122 is realized without an additional metal trace fabrication. Consequently, the process may be simplified.

According to some embodiments, the transmission part for touch signal transmission may be formed in the same layer of one electrode of the light-emitting component or at least one conducting layer of the active device. Thus, after the process of fabricating the light-emitting component, an additional process for forming a metal circuit connecting a signal of the touch component with the external component is not needed. As a result, damage possibly caused to the light-emitting component due to additional metal circuit fabrication may be avoided. According to some embodiments, the first touch part in the touch component may be connected to the second transmission part or the third transmission part made of a metal material by the touch signal transmission line. By doing so, the overall impedance of the touch signal transmission line may be decreased, the transmission and feedback of touch signals may be promoted, and touch efficacy may be effectively improved.

Figure 4:
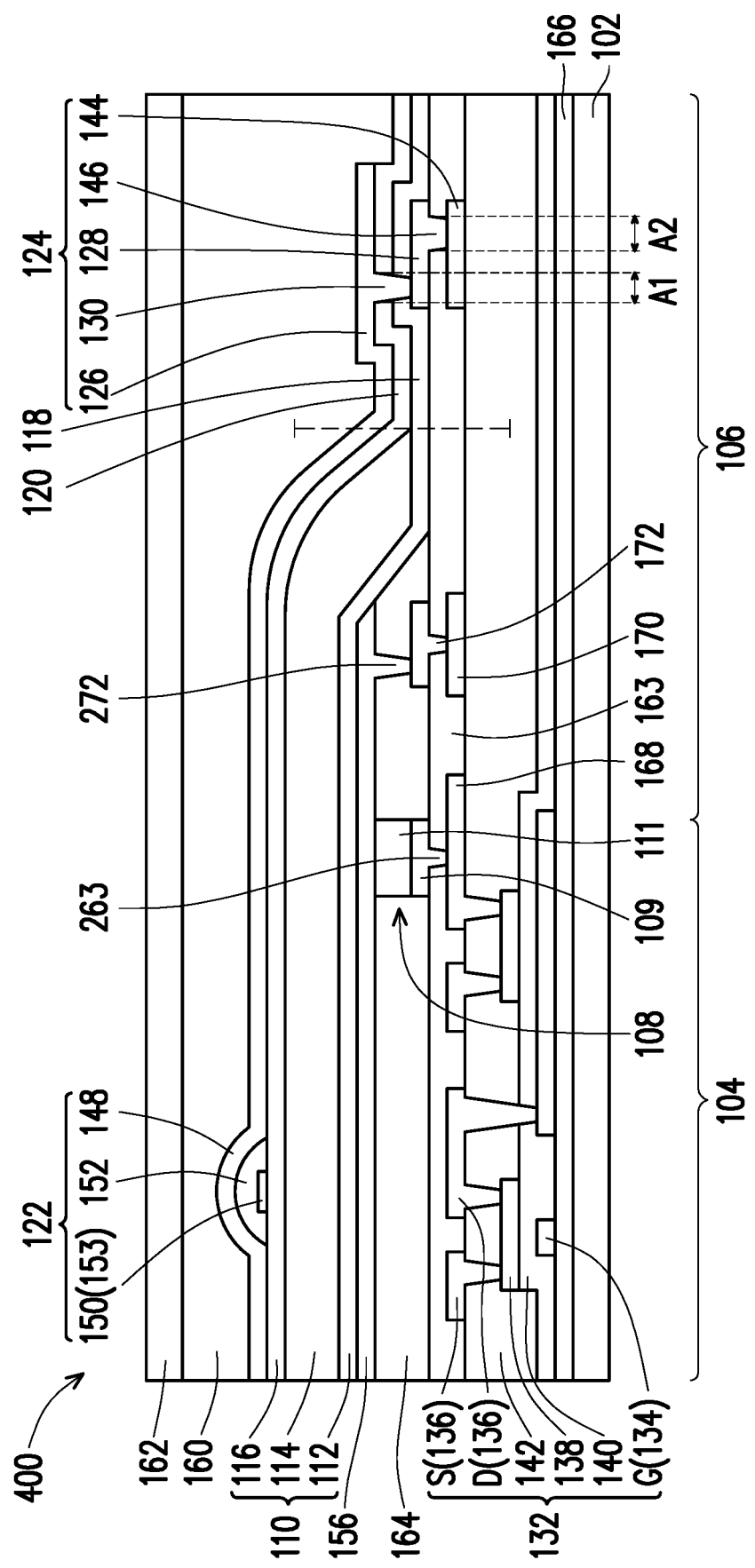
FIG. 4 is a schematic diagram showing a cross-section of an alternative example of the touch display device according to the second embodiment of the present disclosure.

FIG. 4 is a schematic diagram showing a cross-section of an alternative example of the touch display device according to the second embodiment of the present disclosure. A touch display device 400 is different from the touch display device 300 of the second embodiment of the present disclosure in that the touch component 122 is of a bottom bridge structure, i.e., the second connecting parts 153 are located below the first touch part 148. The remaining structures of the touch display device 400 may refer to the second embodiment above, and the descriptions thereof are omitted herein.

Figure 5:
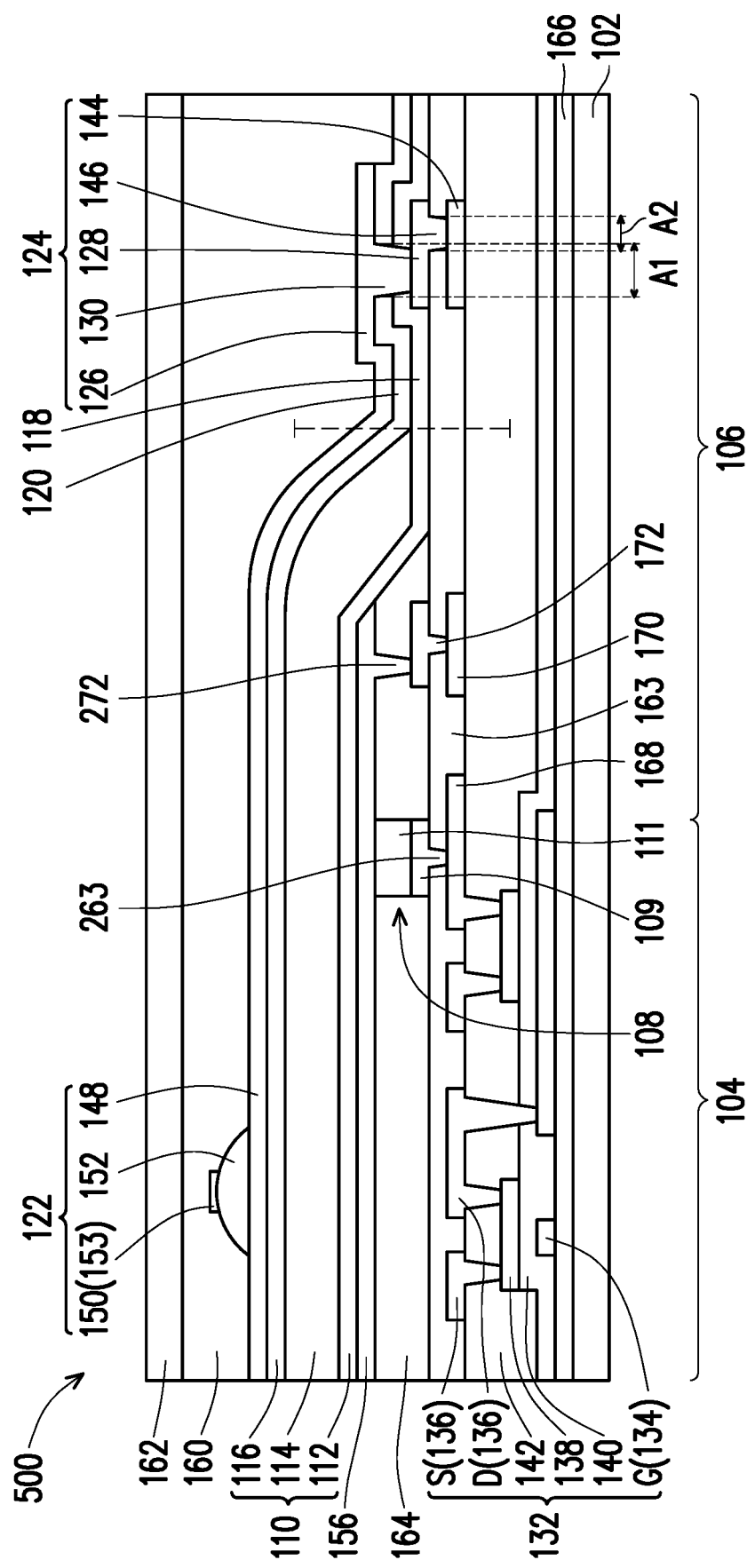
FIG. 5 is a schematic diagram showing a cross-section of a touch display device according to a third embodiment of the present disclosure.

FIG. 5 is a schematic diagram showing a cross-section of a touch display device according to a third embodiment of the present disclosure. The basic structure of a touch display device 500 in FIG. 5 is the same as the basic structure of the touch display device 300 in FIG. 3A, and the detailed description thereof may refer to the foregoing embodiment unless otherwise stated. In the touch display device 500, an area A1 of the projection of the first conductive connection structure 130 on the substrate 102 and an area A2 of the projection of the second conductive connection structure 146 on the substrate 102 are partially overlapped.

Figure 6:
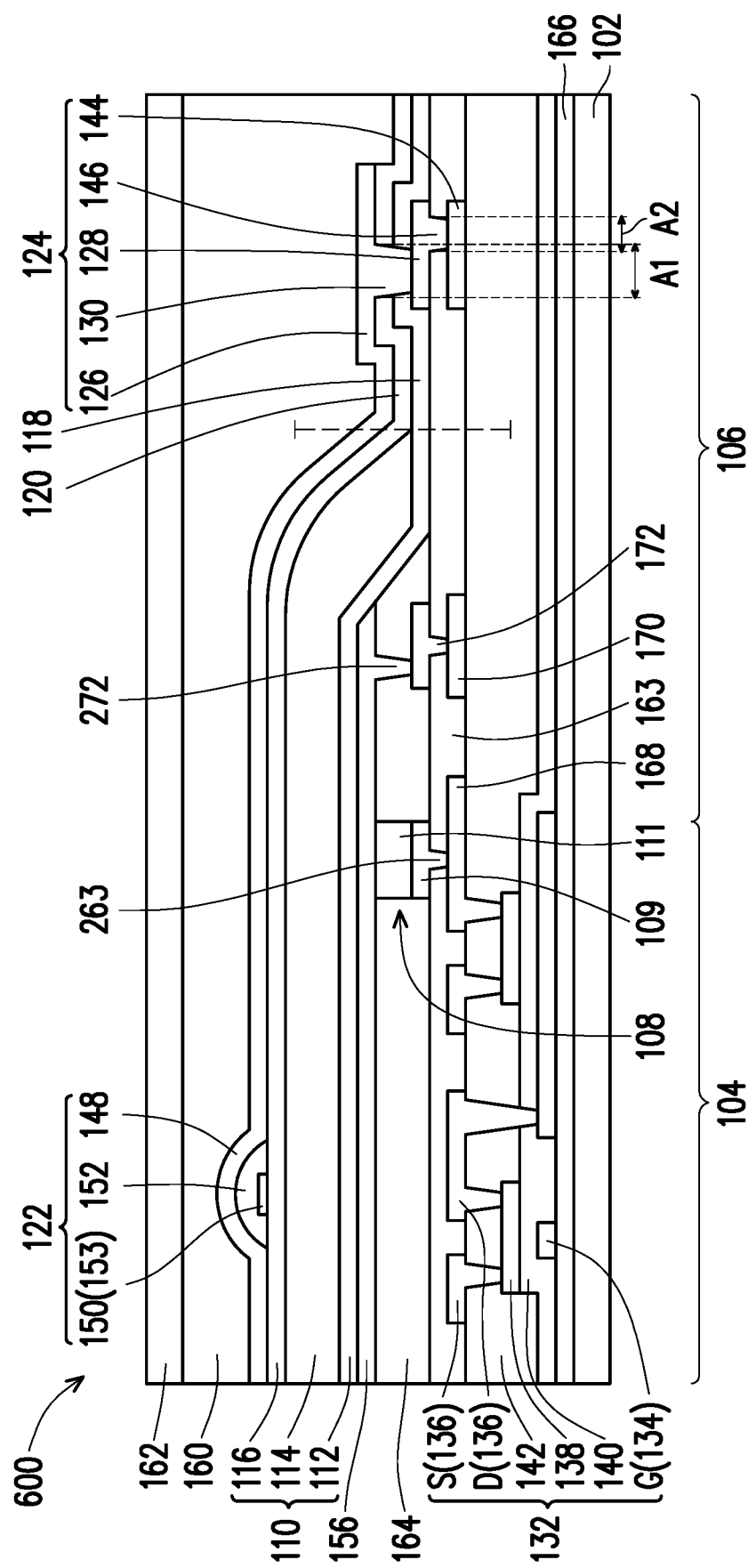
FIG. 6 is a schematic diagram showing a cross-section of an alternative example of the touch display device according to the third embodiment of the present disclosure.

FIG. 6 is a schematic diagram showing a cross-section of an alternative example of the touch display device according to the third embodiment of the present disclosure. A touch display device 600 is different from the touch display device 500 of the third embodiment of the present disclosure in that the touch component 122 is of a bottom bridge structure, i.e., the second connecting parts 153 are located below the first touch part 148. The remaining structures of the touch display device 600 may refer to the third embodiment above, and the descriptions thereof are omitted herein.

Figure 7:
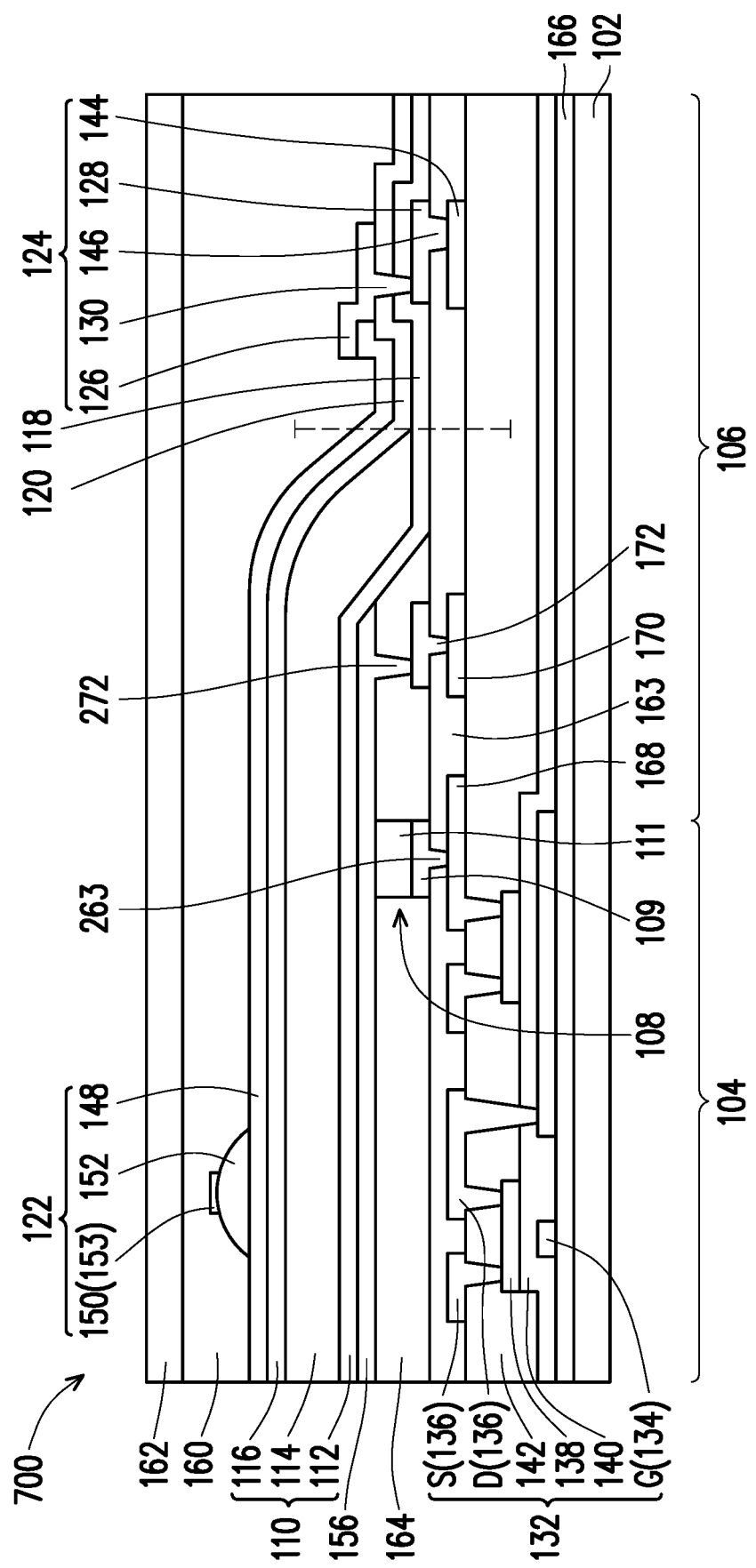
FIG. 7 is a schematic diagram showing a cross-section of a touch display device according to a fourth embodiment of the present disclosure.

FIG. 7 is a schematic diagram showing a cross-section of a touch display device according to a fourth embodiment of the present disclosure. The basic structure of a touch display device 700 in FIG. 7 is the same as the basic structure of the touch display device 300 in FIG. 3A, and the detailed description thereof may refer to the second embodiment above unless otherwise stated. In the touch display device 700, the first transmission part 126 and the second connecting parts 153 can be of the same layer, but the first transmission part 126 and the first touch part 148 are different layers. Specifically, the first transmission part 126 and multiple bridges (the second connecting parts 153) are formed simultaneously by using the same material during the same process. For example, the first transmission part 126 and the second connecting parts 153 are made of the same material. Because the touch component 122 in FIG. 7, for example, is of a top bridge structure, part of the first transmission part 126 may overlap with the touch part 148 to electrically connect to the touch part 148. According to some embodiments, the second connecting parts 153, the first transmission part 126, and the first conductive connection structure 130 may be formed simultaneously by using the same material with the same process. For example, the second connecting parts 153, the first transmission part 126, and the first conductive connection structure 130 may be made of the same material, and may be of the same layer.

Figure 8:
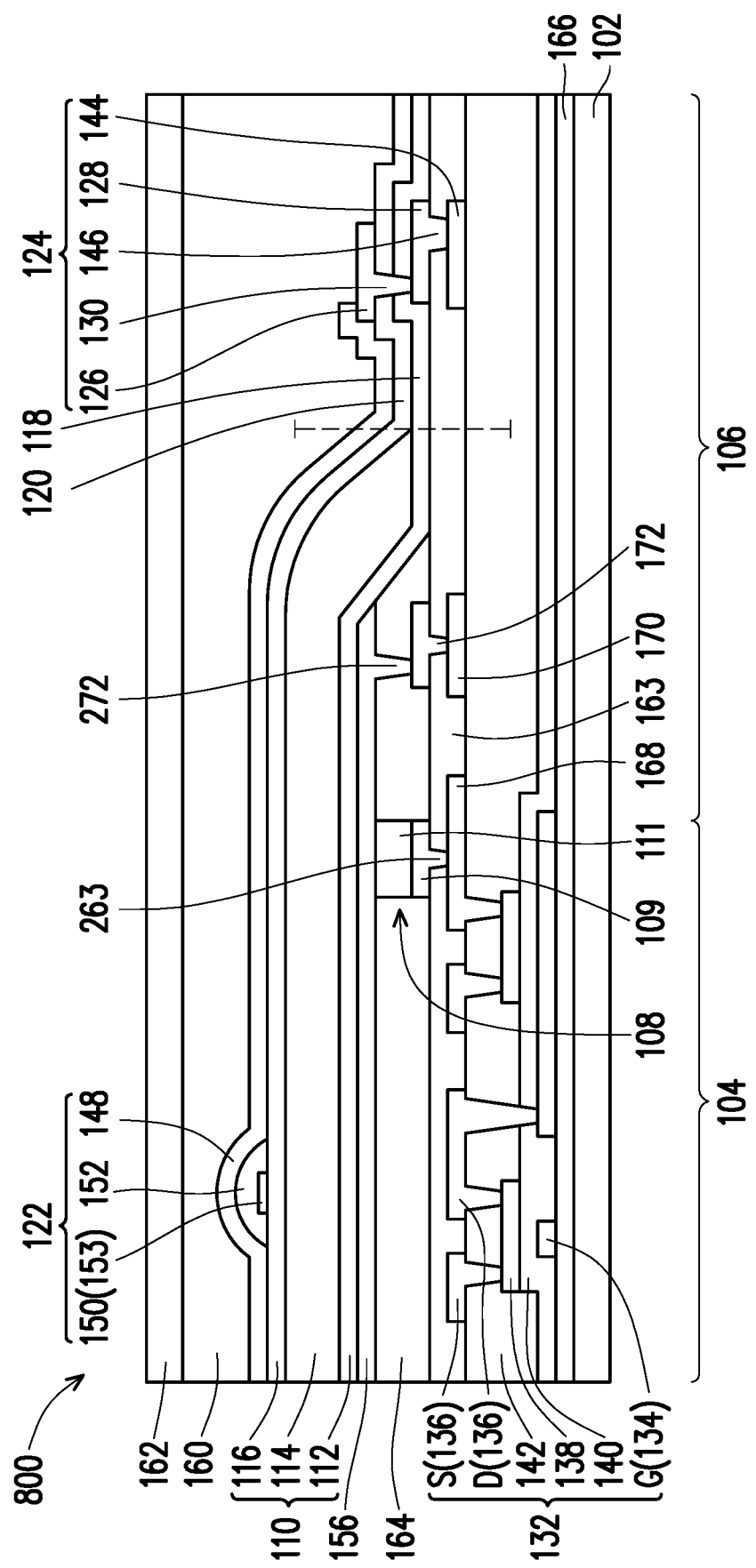
FIG. 8 is a schematic diagram showing a cross-section of an alternative example of the touch display device according to the fourth embodiment of the present disclosure.

FIG. 8 is a schematic diagram showing a cross-section of an alternative example of the touch display device according to the fourth embodiment of the present disclosure. A touch display device 800 is different from the touch display device 700 of the fourth embodiment of the present disclosure in that the touch component 122 is of a bottom bridge structure, i.e., the second connecting parts 153 are located below the first touch part 148. Hence, part of the first touch part 148 overlaps with the first transmission part 126 to electrically connect the first transmission part 126. The remaining structures of the touch display device 800 may refer to the fourth embodiment of the present disclosure, and the descriptions thereof are omitted herein.

Figure 9:
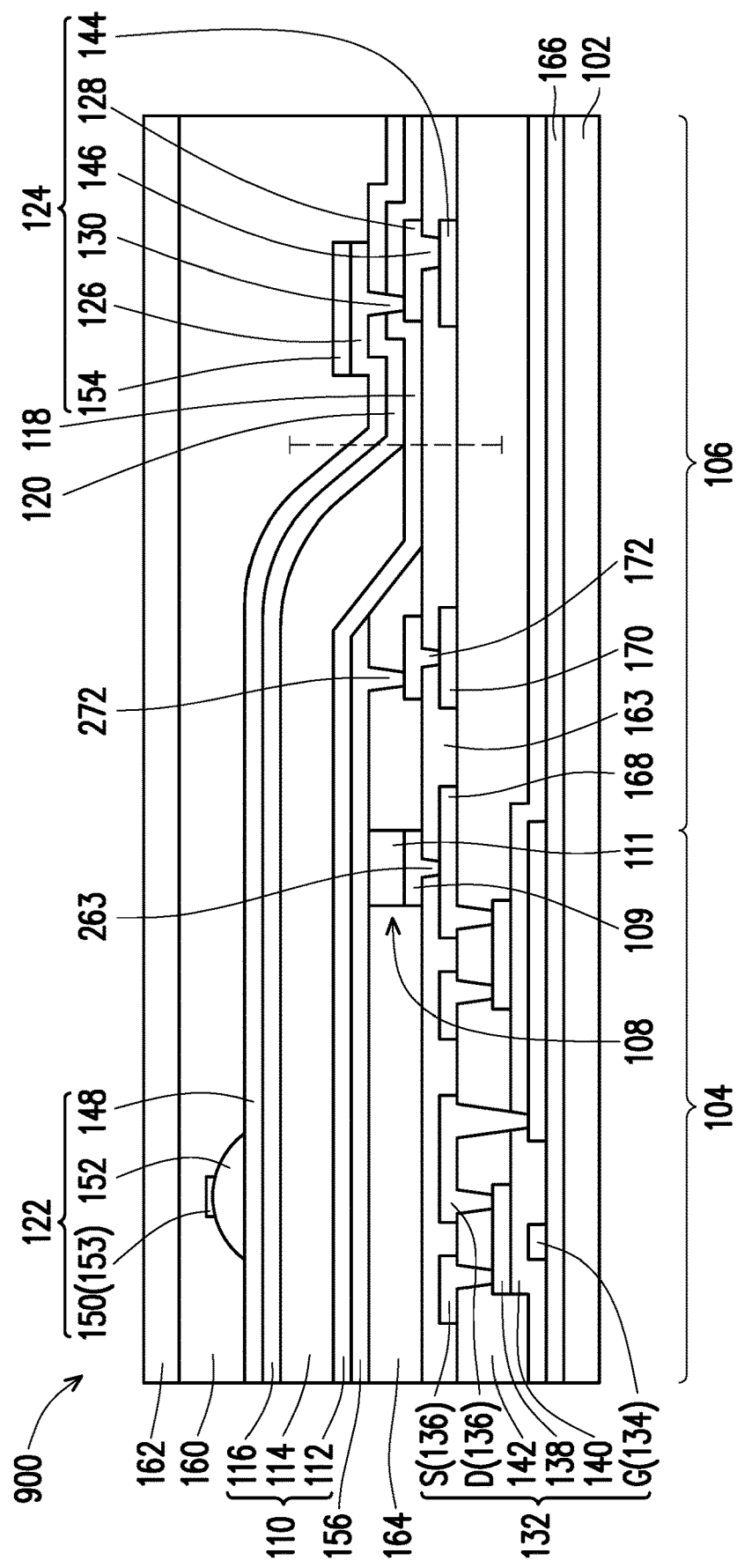
FIG. 9 is a schematic diagram showing a cross-section of a touch display device according to a fifth embodiment of the present disclosure.

FIG. 9 is a schematic diagram showing a cross-section of a touch display device according to a fifth embodiment of the present disclosure. The basic structure of a touch display device 900 in FIG. 9 is the same as the basic structure of the touch display device 300 in FIG. 3A, and the detailed description thereof may refer to the second embodiment above unless otherwise stated. In the touch display device 900, the touch signal transmission line 124 further includes an auxiliary transmission line part 154. The auxiliary transmission line part 154 and the first transmission part 126 can be overlapped, and the auxiliary transmission line part 154 and the second connecting part 153 can be of the same layer and be made of the same material. By overlaying the auxiliary transmission line part 154 on the first transmission part 126, not only the overall impedance of the touch signal transmission line 124 may be lowered, but also an assistant structure to repair a possible line breakage of part of the first transmission part 126 may be provided, thus improving process yield and promoting touch efficacy.

Figure 10:
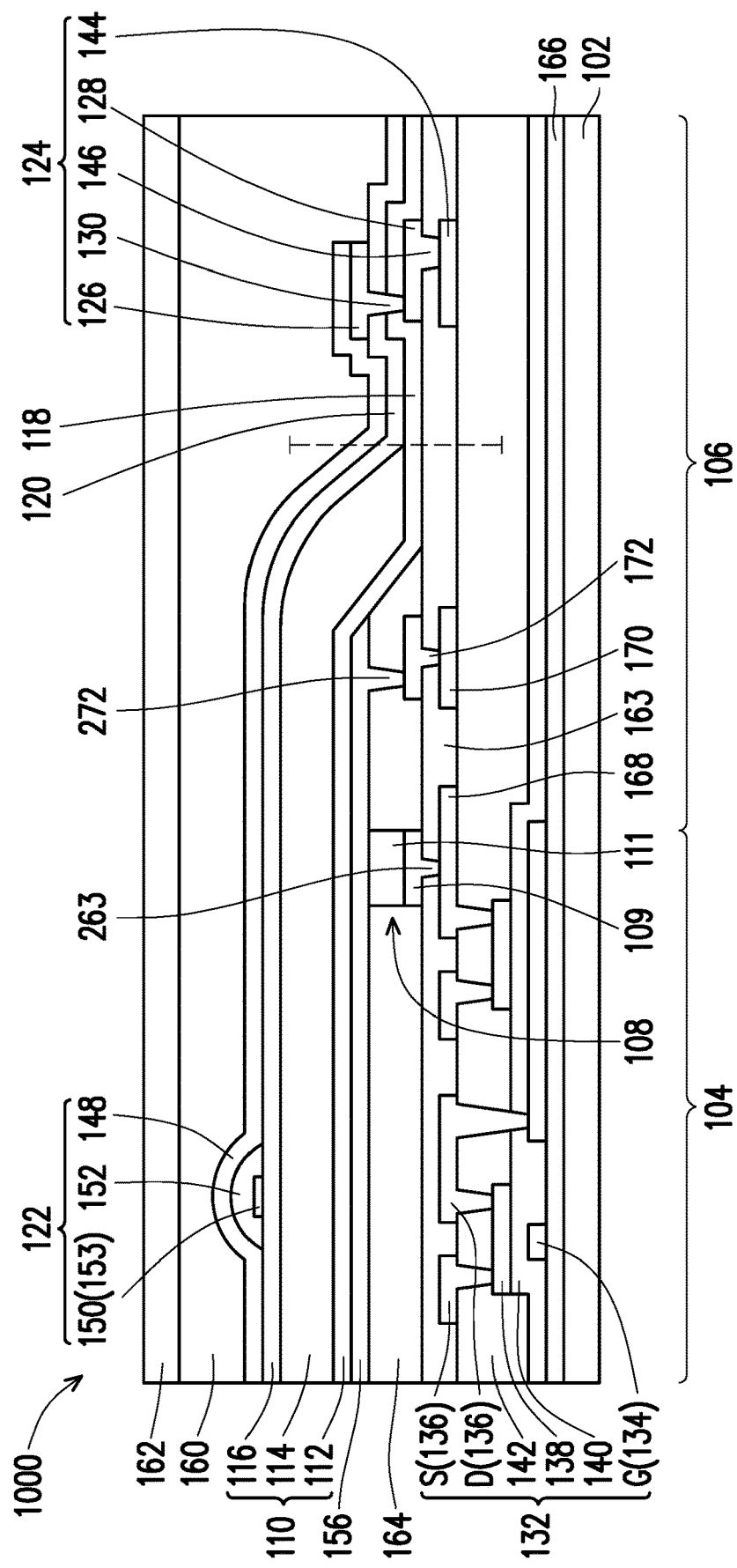
FIG. 10 is a schematic diagram showing a cross-section of an alternative example of the touch display device according to the fifth embodiment of the present disclosure.

FIG. 10 is a schematic diagram showing a cross-section of an alternative example of the touch display device according to the fifth embodiment of the present disclosure. A touch display device 1000 in FIG. 10 is mainly different from the touch display device 900 in FIG. 9 in that the touch component 122 is of a bottom bridge structure (i.e., the second connecting parts 153 are located below the first touch part 148), and the first transmission part 126 and the second connecting parts 153 can be of the same layer. The basic structure of a touch display device 1000 in FIG. 10 is the same as the basic structure of the touch display device 800 in FIG. 8, and the detailed description thereof may refer to the second embodiment above unless otherwise stated. In the touch display device 1000, multiple bridges (second connecting parts 153) and the first transmission part 126 can be formed during the same process before the first touch part 148 is formed, so that the first touch part 148 stacks on the first transmission part 126, and covers the first transmission part 126.

Figure 11A:
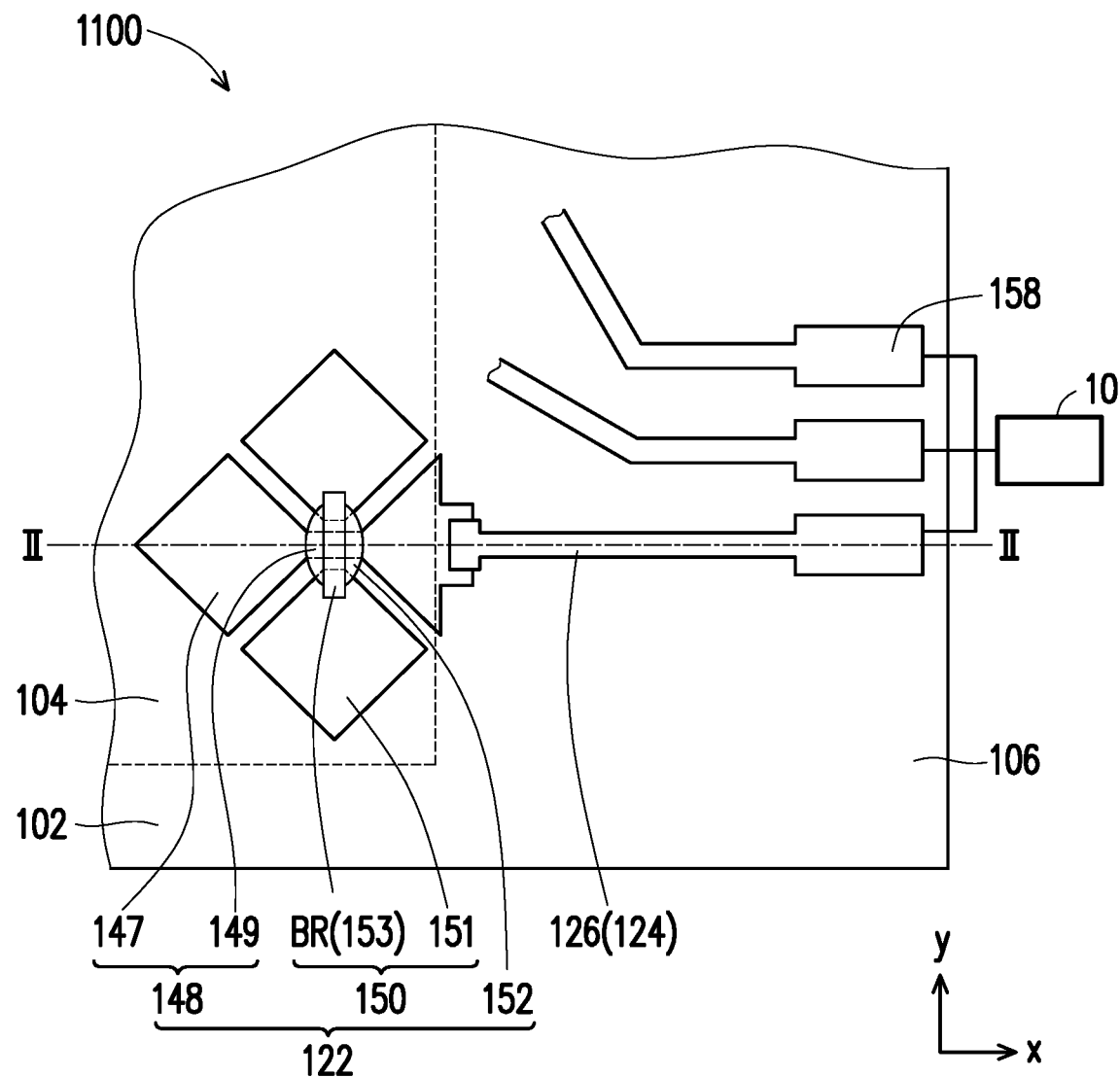
FIG. 11A is a schematic diagram showing a local top view of a touch display device according to a sixth embodiment of the present disclosure.
Figure 11B:
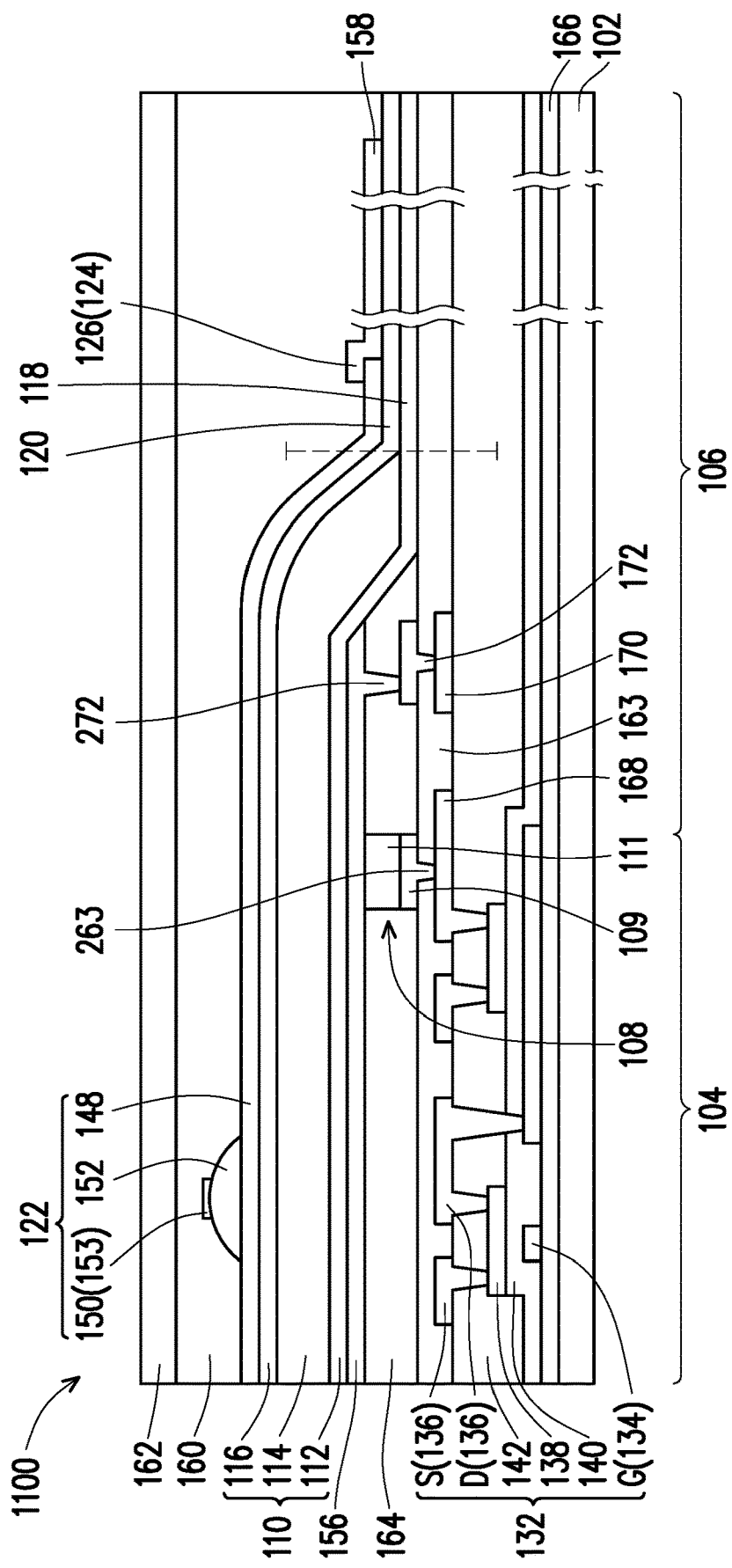
FIG. 11B is a schematic diagram showing a cross-section of the touch display device of FIG. 11A taken along a line II-II.

FIG. 11A is a schematic diagram showing a local top view of a touch display device according to a sixth embodiment of the present disclosure. FIG. 11B is a schematic diagram showing a cross-section of the touch display device of FIG. 11A taken along a line II-II. Referring to FIG. 11A and FIG. 11B at the same time, the basic structure of a touch display device 1100 is the same as the basic structure of the touch display device 100 in FIG. 1B, and the detailed description thereof may refer to the first embodiment above unless otherwise stated. In the touch display device 1100, the first transmission part 126 and the second connecting parts 153 can be of the same layer. Specifically, the first transmission part 126 and multiple bridges (the second connecting parts 153) are formed simultaneously, and may be made of the same material. Because the touch component 122 of the sixth embodiment of the present disclosure, for example, is of a top bridge structure, part of the first transmission part 126 overlaps with the first touch part 148 to electrically connect to the first touch part 148. Besides, in the present embodiment, the first transmission part 126 may directly serve as the touch signal transmission line 124 and extend to an external device, e.g., a processing unit 10. The first transmission part 126 may be electrically connected to a processing unit 10 for transmitting signals via a bonding part 158.

In the present embodiment, the touch type of the touch display device is a mutual-capacitance type, the first touch part 148 may be a driving electrode for receiving a driving signal, and the second touch part 150 may be a sensing electrode for passing a sensing signal back to the processing unit. Alternatively, the first touch part 148 may be a driving electrode, and the second touch part 150 may be a sensing electrode. In other embodiments, the touch type of the touch display device may also be a self-capacitance type.

Figure 11C:
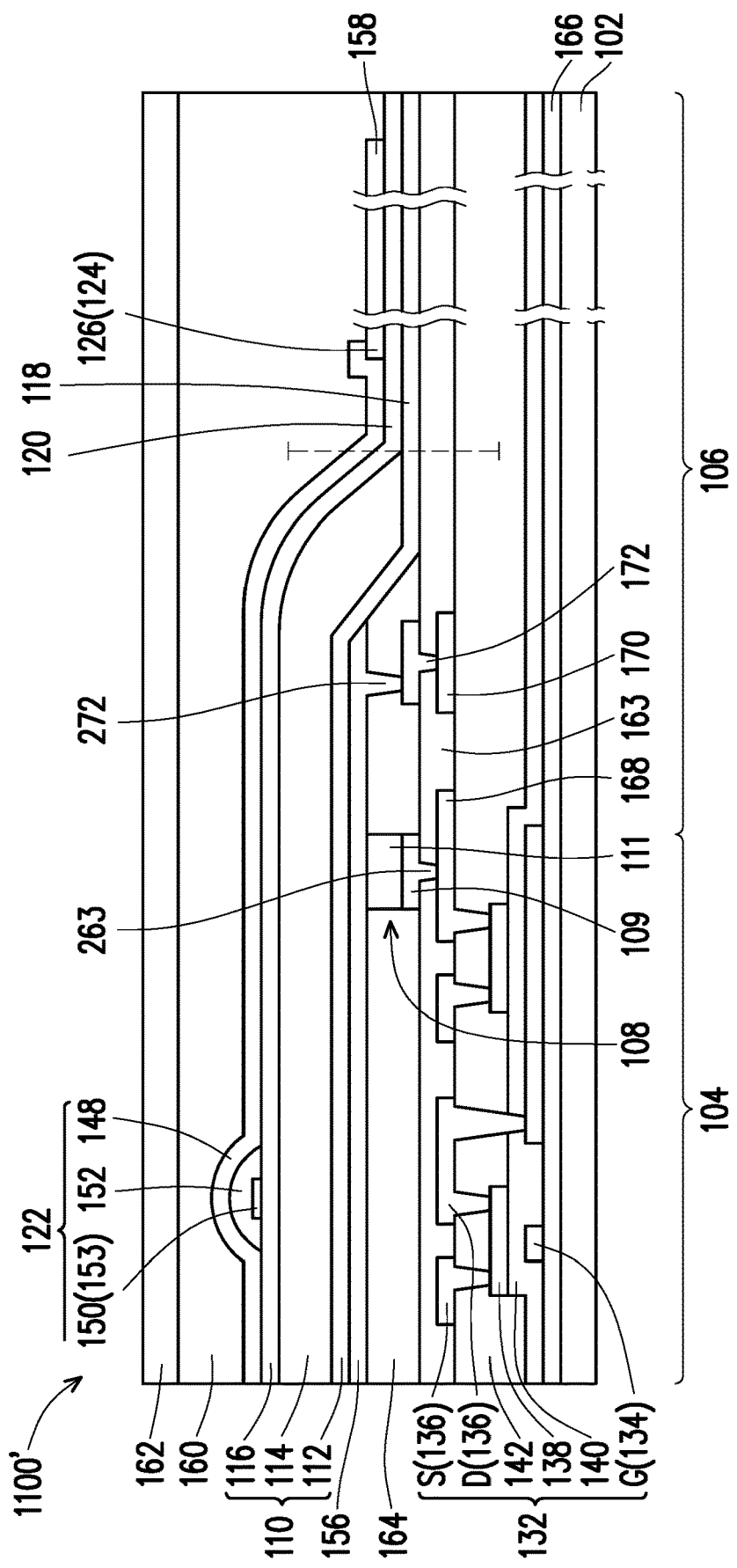
FIG. 11C is a schematic diagram showing a cross-section of an alternative example of the touch display device according to the sixth embodiment of the present disclosure.

FIG. 11C is a schematic diagram showing a cross-section of an alternative example of the touch display device according to the sixth embodiment of the present disclosure. A touch display device 1100' is different from the touch display device 1100 in that the touch component 122 is of a bottom bridge structure, i.e., the second connecting parts 153 are located below the first touch part 148. Hence, part of the first touch part 148 overlaps with the first transmission part 126 to electrically connect to the first transmission part 126, and the first transmission part 126 may directly serve as the touch signal transmission line 124 and extend to the bonding part 158. The remaining structures of the touch display device 1100' may refer to the aforementioned touch display device 1100, and the descriptions thereof are omitted herein.

Figure 12A:
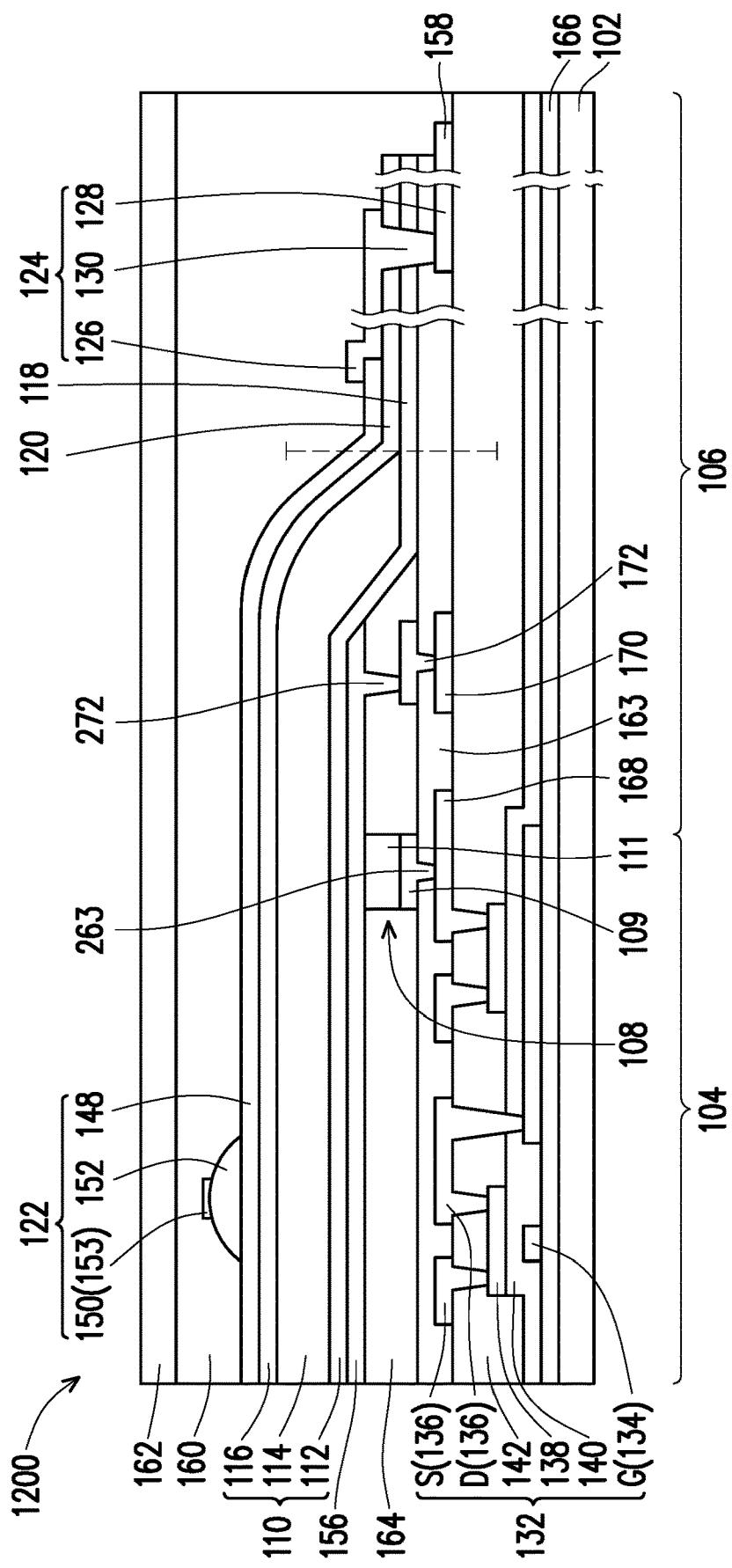
FIG. 12A is a schematic diagram showing a cross-section of an alternative example of the touch display device of FIG. 11B.

FIG. 12A is a schematic diagram showing a cross-section of an alternative example of the touch display device of FIG. 11B. The touch display device 1200 in FIG. 12A further includes a second transmission part 128 of the same layer as the second conducting layer 136, and the end of the second transmission part 128 may be connected to the bonding part 158. That is, the second transmission part 128, the source S, and the drain D are formed during the same process. Here, the first conductive connection structure 130 penetrates through the first inorganic layer 112 and the second inorganic layer 116, and may also penetrate through the second insulating layer 163, so that the first transmission part 126 is connected to the second transmission part 128. The basic structure of a touch display device 1200 in FIG. 12A is the same as the basic structure of the touch display device 1100, and the detailed description thereof may refer to the touch display device 1100 above unless otherwise stated.

Figure 12B:
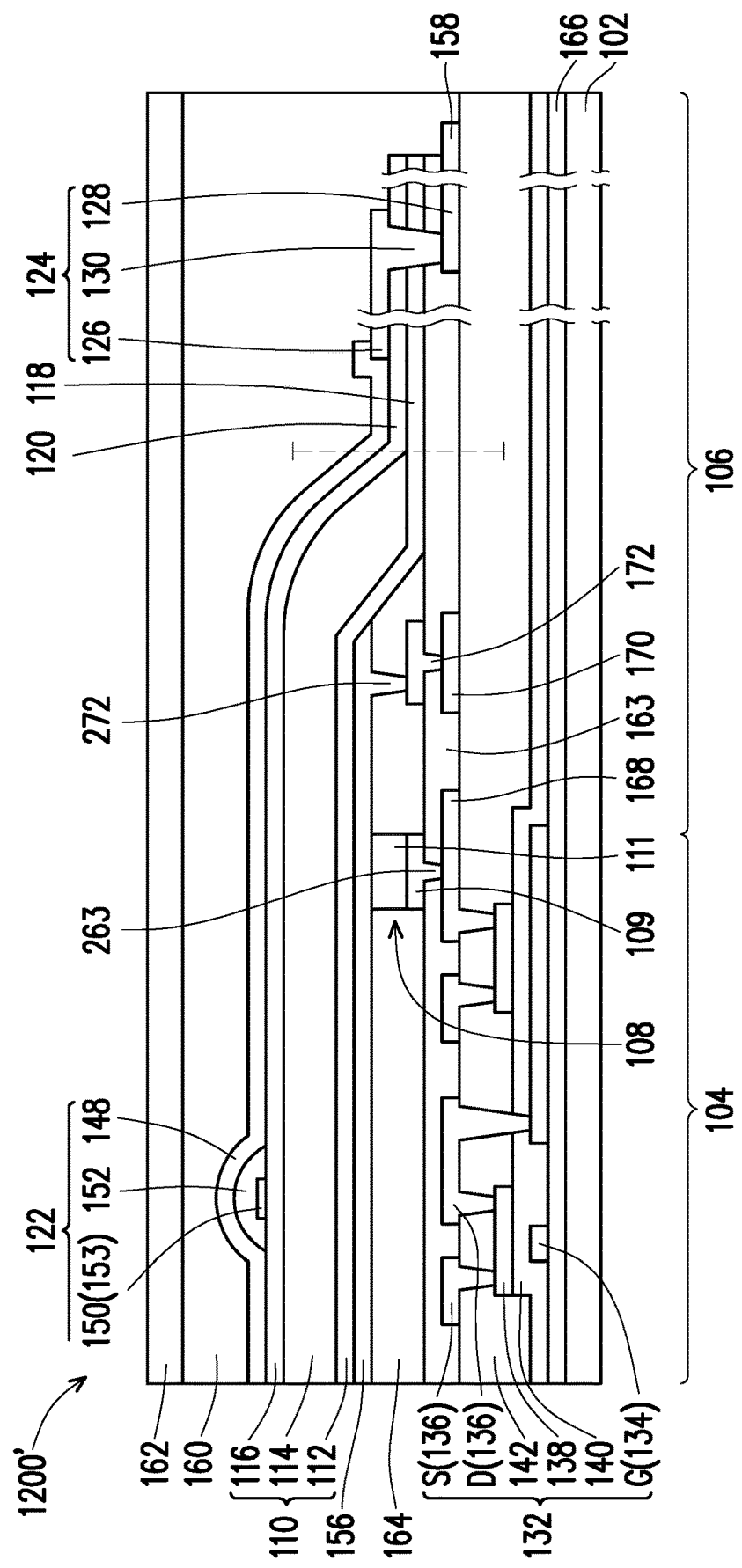
FIG. 12B is a schematic diagram showing a cross-section of an alternative example of the touch display device of FIG. 11C.

FIG. 12B is a schematic diagram showing a cross-section of an alternative example of the touch display device of FIG. 11C. A touch display device 1200' in FIG. 12B is different from the touch display device 1200 in FIG. 12A in that the touch component 122 is of a bottom bridge structure (i.e., the second connecting parts 153 are located below the first touch part 148). Compared with FIG. 11C, the touch display device 1200' in FIG. 12B further includes a second transmission part 128 of the same layer as the second conducting layer 136, and the bonding part 158 is connected to the end of the second transmission part 128. The second transmission part 128, the source S, and the drain D are formed during the same process. Here, the first conductive connection structure 130 penetrates through the first inorganic layer 112 and the second inorganic layer 116, and may also penetrate through the second insulating layer 163, so that the first transmission part 126 is connected to the second transmission part 128. The basic structure of a touch display device 1200' in FIG. 12B is the same as the basic structure of the touch display device 1100', and the detailed descriptions thereof may refer to the touch display device 1100' above unless otherwise stated.

Figure 13A:
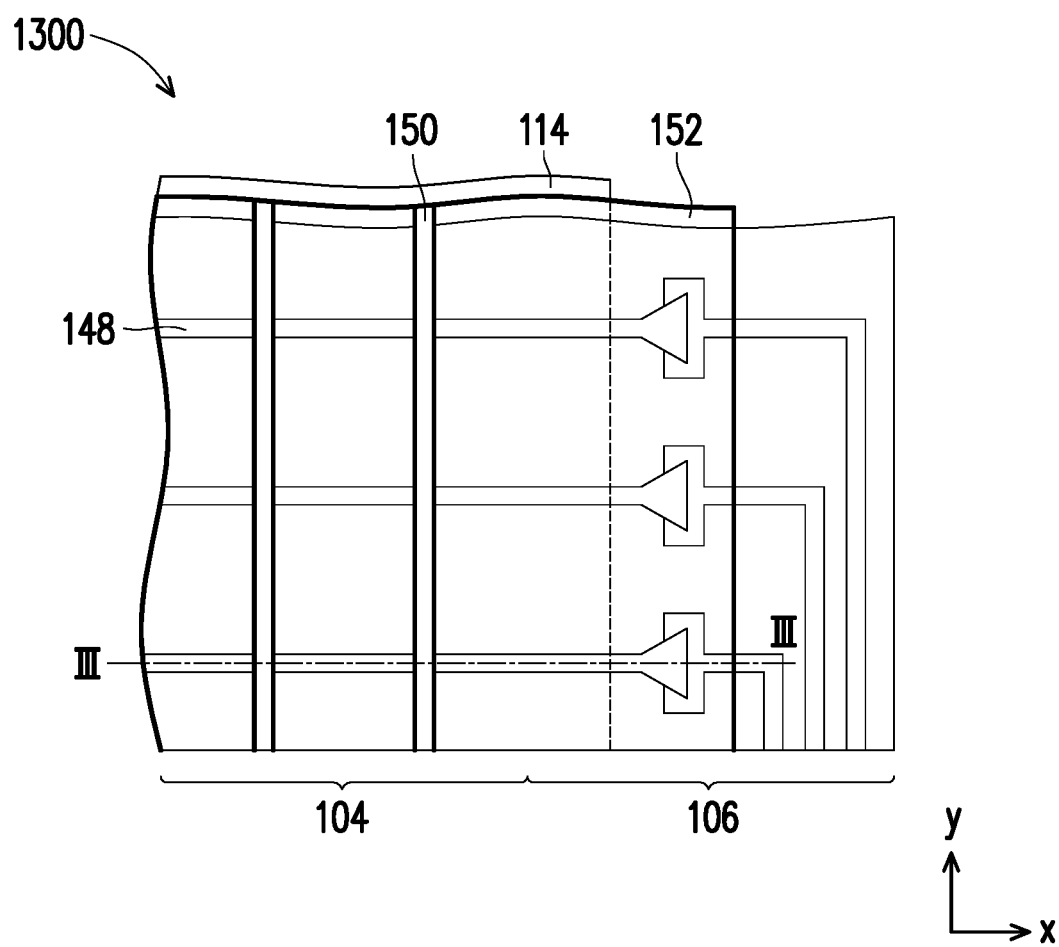
FIG. 13A is a schematic diagram showing a local top view of a touch display device according to a seventh embodiment of the present disclosure.
Figure 13B:
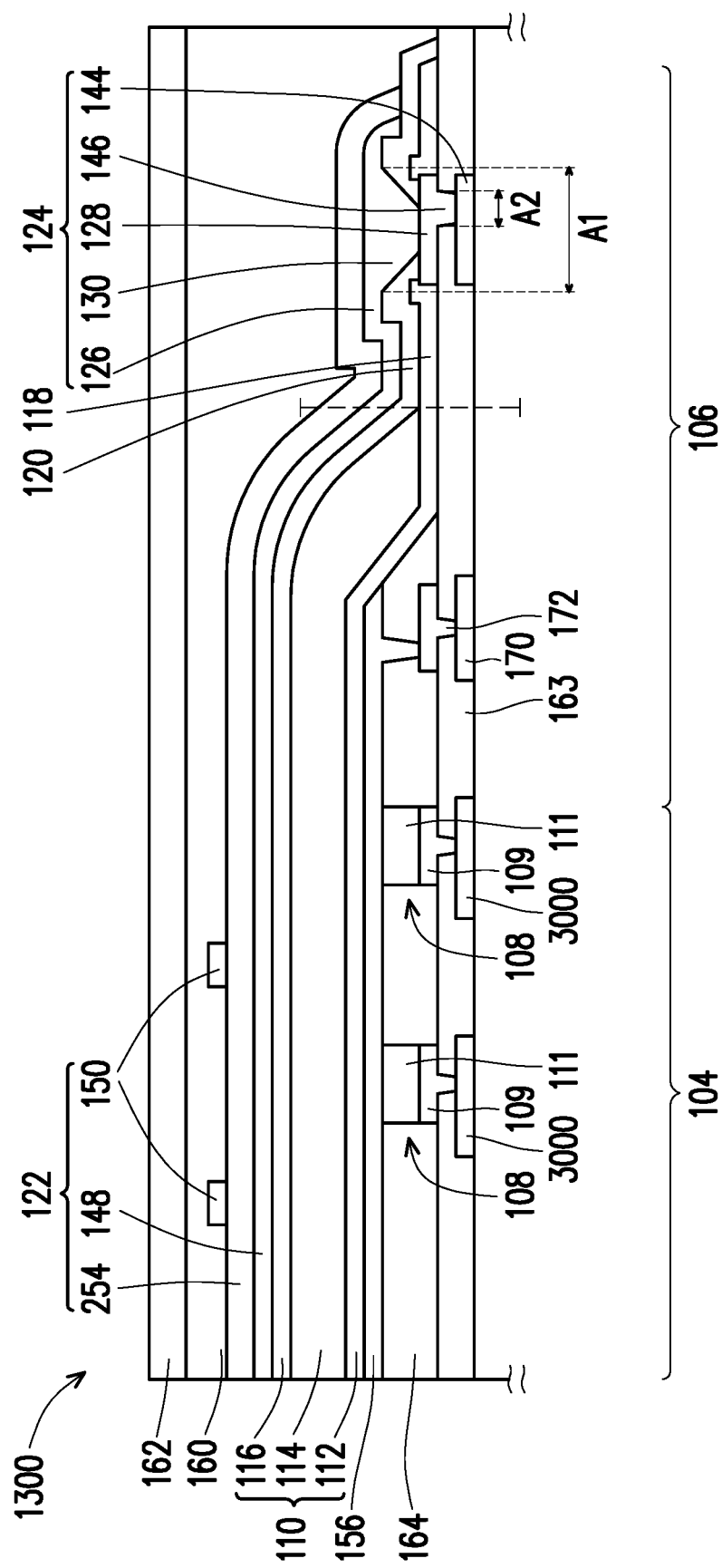
FIG. 13B is a schematic diagram showing a cross-section of the touch display device of FIG. 13A taken along a line III-III.

FIG. 13A is a schematic diagram showing a local top view of a touch display device according to a seventh embodiment of the present disclosure. FIG. 13B is a schematic diagram showing a cross-section of the touch display device of FIG. 13A taken along a line III-III.

Referring to FIG. 13A and FIG. 13B at the same time, the basic structure of a touch display device 1300 in FIG. 13A and FIG. 13B is the same as the basic structure of the touch display device 500 in FIG. 5, and the detailed descriptions thereof may refer to the third embodiment above unless otherwise stated. In the touch display device 1300 in FIG. 13A, some but not all layers are exemplarily shown; in the touch display device 1300 in FIG. 13B, the complete structure of the thin film transistor 132 is omitted, and only a thin film transistor layer 3000 is drawn as a representative. The remaining structures of the thin film transistor 132 may refer to the foregoing embodiment. In the present embodiment, the touch component 122, for example, is of a double indium tin oxide (DITO) structure. A fourth insulating layer 254 is disposed between the first touch part 148 and the second touch part 150. The first touch part 148, for example, extends along a first direction x; the second touch part 150, for example, extends along a second direction y, and the first direction x and the second direction y are different (the first direction x and the second direction y, for example, are orthogonal to each other, and may also intersect each other in a non-orthogonal way). The touch display device 1300 may include multiple first touch parts 148 and multiple second touch parts 150. The multiple first touch parts 148 are arranged along the second direction y, and the multiple second touch parts 150 are arranged along the first direction x. In the present embodiment, the touch type of the touch display device is a mutual-capacitance type; the first touch part 148 may be a driving electrode for receiving a driving signal, and the second touch part 150 may be a sensing electrode for passing a sensing signal back to the processing unit. Alternatively, the first touch part 148 may be a sensing electrode, and the second touch part 150 may be a driving electrode.

In the seventh embodiment of the present disclosure, the first inorganic layer 112 and the second inorganic layer 116 have a taper structure in a position at an edge of the first conductive connection structure 130 and away from the display area 104. The first inorganic layer 112 and the second inorganic layer 116 partially cover the second transmission part 128, and fluctuate along the profile of the second transmission part 128. Consequently, the first transmission part 126 disposed on the second inorganic layer 116 may have a protruded surface corresponding to the second transmission part 128.

Figure 14:
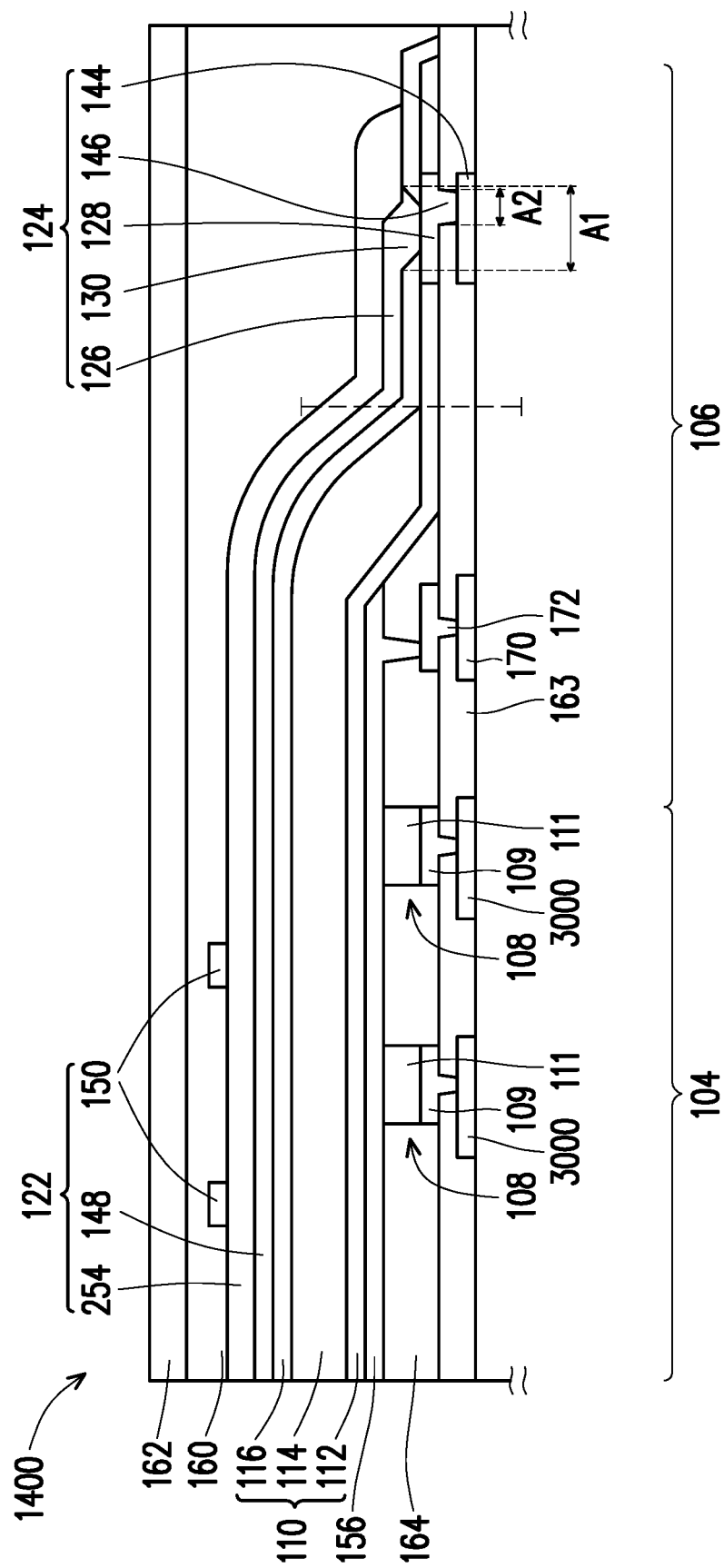
FIG. 14 is a schematic diagram showing a cross-section of an alternative example of the touch display device according to the seventh embodiment of the present disclosure.

FIG. 14 is a schematic diagram showing a cross-section of an alternative example of a touch display device according the seventh embodiment of the present disclosure. A touch display device 1400 is different from the touch display device 1300 of the seventh embodiment of the present disclosure in that the thickness of the first inorganic layer 112 and the thickness of the second transmission part 128 are approximately equal, and the first inorganic layer 112 does not overlap with the second transmission part 128, so that the first inorganic layer 112 and the second transmission part 128 form an approximately flat surface, and the second inorganic layer 116 partially covers the second transmission part 128. Thus, the second inorganic layer 116 has no obvious fluctuation corresponding to the second transmission part 128, so that the first transmission part 126 has a flat surface outside the edge of the organic layer 114. The remaining structures of the touch display device 1400 can refer to the seventh embodiment of the present disclosure, and the descriptions thereof are omitted herein.

Figure 15:
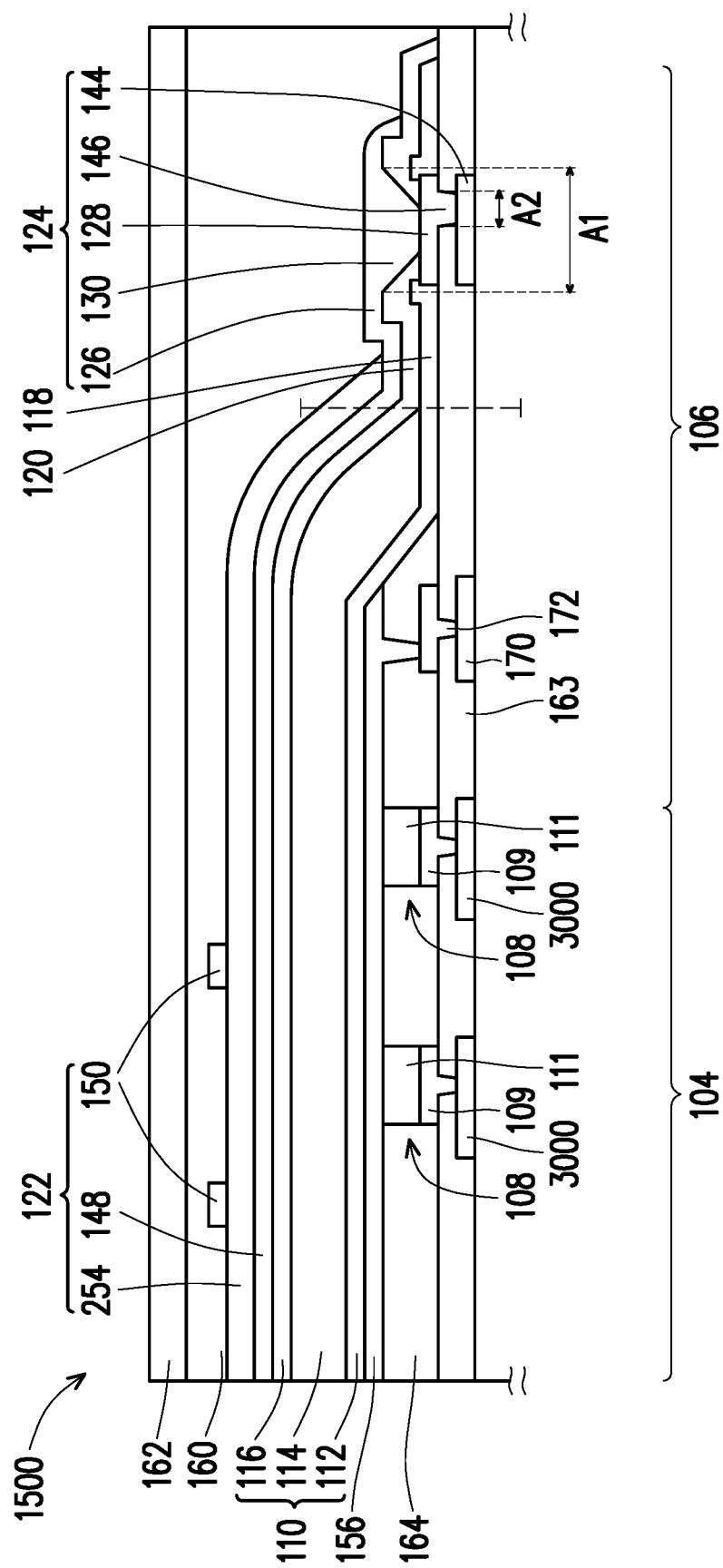
FIG. 15 is a schematic diagram showing a cross-section of a further alternative example of the touch display device according to the seventh embodiment of the present disclosure.

FIG. 15 is a schematic diagram showing a cross-section of a further alternative example of the touch display device of the seventh embodiment of the present disclosure. A touch display device 1500 is different from the touch display device 1300 of the seventh embodiment of the present disclosure in that the fourth insulating layer 254 does not cover the first transmission part 126. The remaining structures of the touch display device 1500 may refer to the seventh embodiment of the present disclosure, and the descriptions thereof are omitted herein.

Figure 16A:
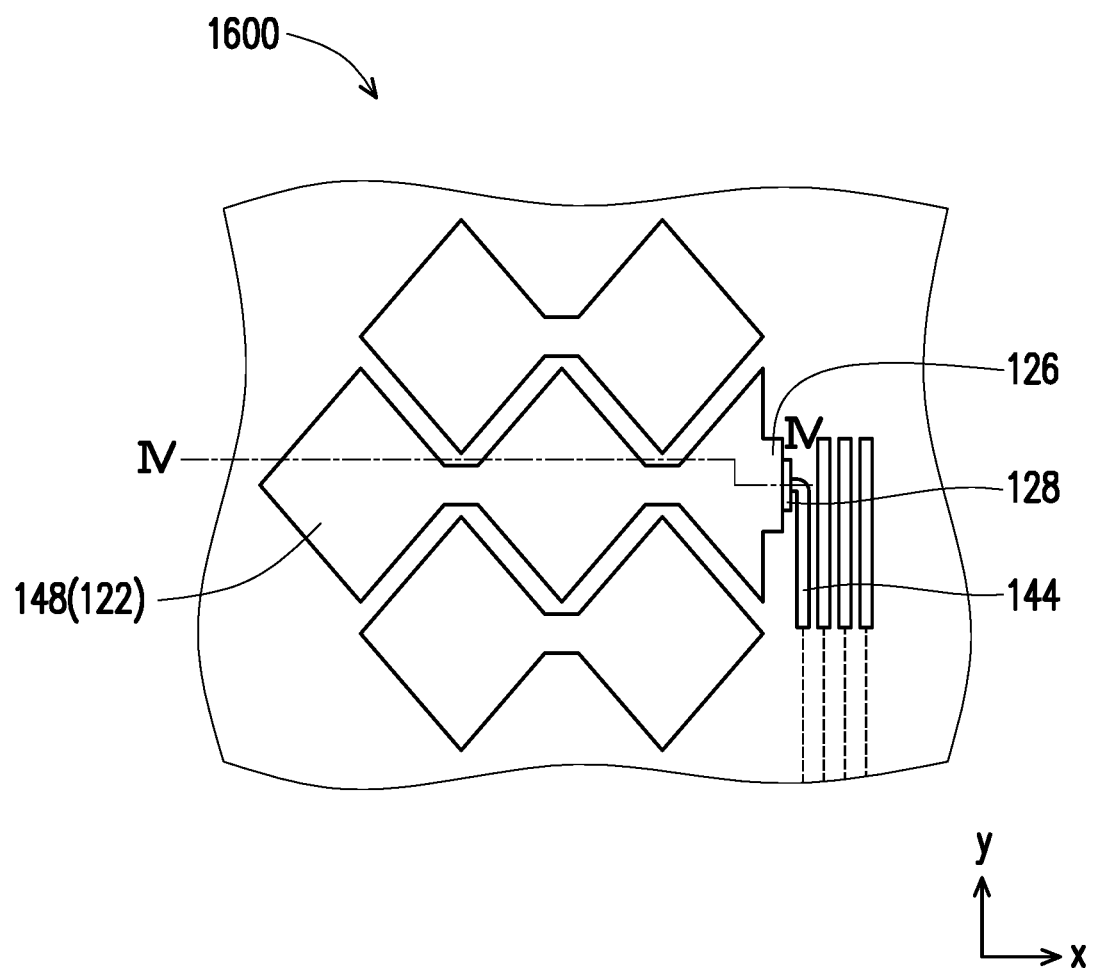
FIG. 16A is a schematic diagram showing a local top view of a touch display device according to an eighth embodiment of the present disclosure.
Figure 16B:
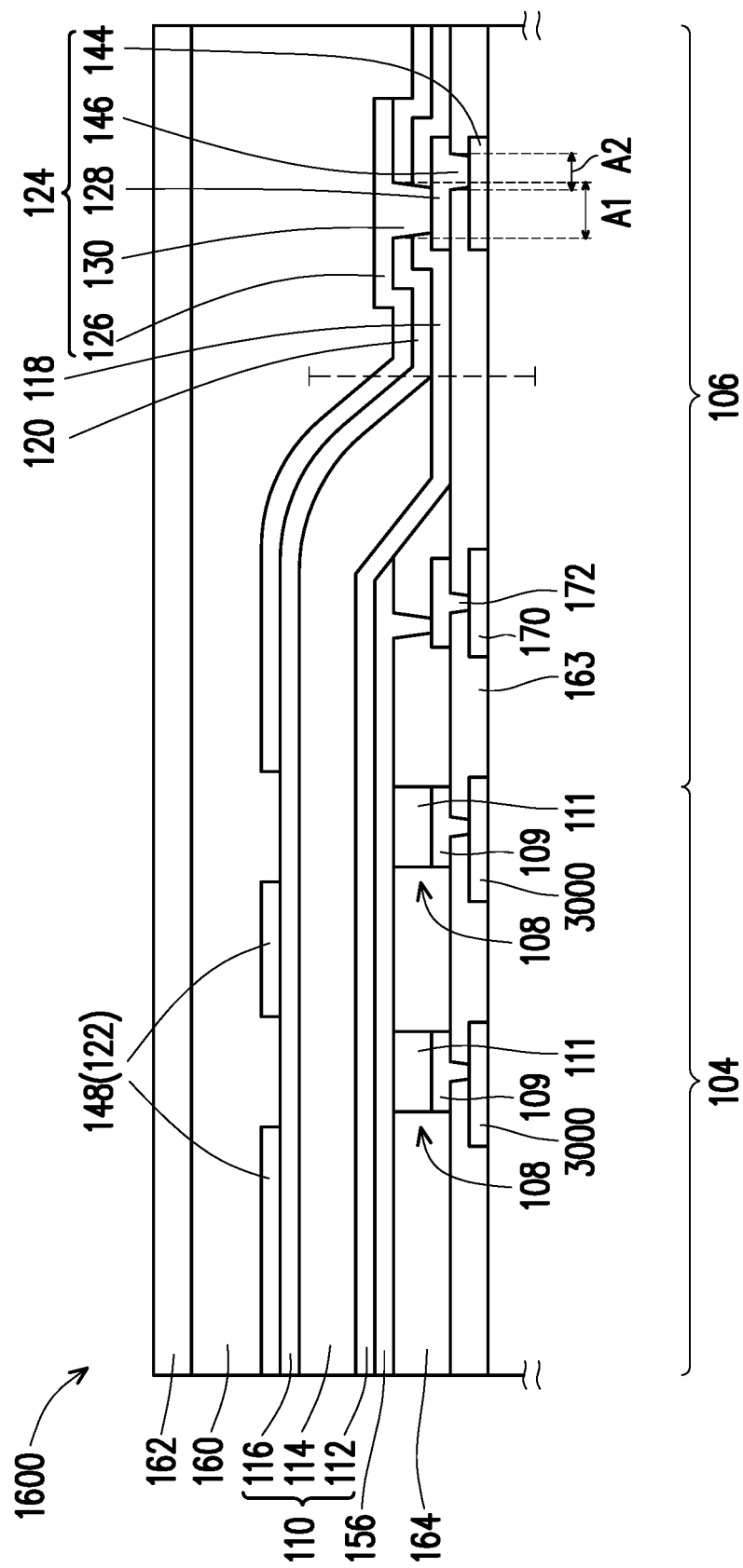
FIG. 16B is a schematic diagram showing a cross-section of the touch display device of FIG. 16A taken along a line IV-IV.

FIG. 16A is a schematic diagram showing a local top view of a touch display device according to an eighth embodiment of the present disclosure. FIG. 16B is a schematic diagram showing a cross-section of the touch display device of FIG. 16A taken along a line Iv-Iv.

Referring to FIG. 16A and FIG. 16B at the same time, the basic structure of a touch display device 1600 in FIG. 16A and FIG. 16B is the same as the basic structure of the touch display device 500 in FIG. 5, and the detailed descriptions thereof may refer to the third embodiment above unless otherwise stated. Besides, in the touch display device 1600, the complete structure of the thin film transistor 132 is omitted, and only a thin film transistor layer 3000 is drawn as a representative. In the present embodiment, the touch component 122, for example, is a touch component in a single-layer solution layer form, i.e., the touch component 122 includes only one touch part, the first touch part 148. In addition, the first touch part 148 and the light-emitting layer 111 are disposed in a staggered way, so the first touch part 148 does not cover the light-emitting layer 111. In the present embodiment, the touch type of the touch display device may be a self-capacitance type, and the first touch part 148 may receive a driving signal and pass a sensing signal back to the processing unit.

Figure 17:
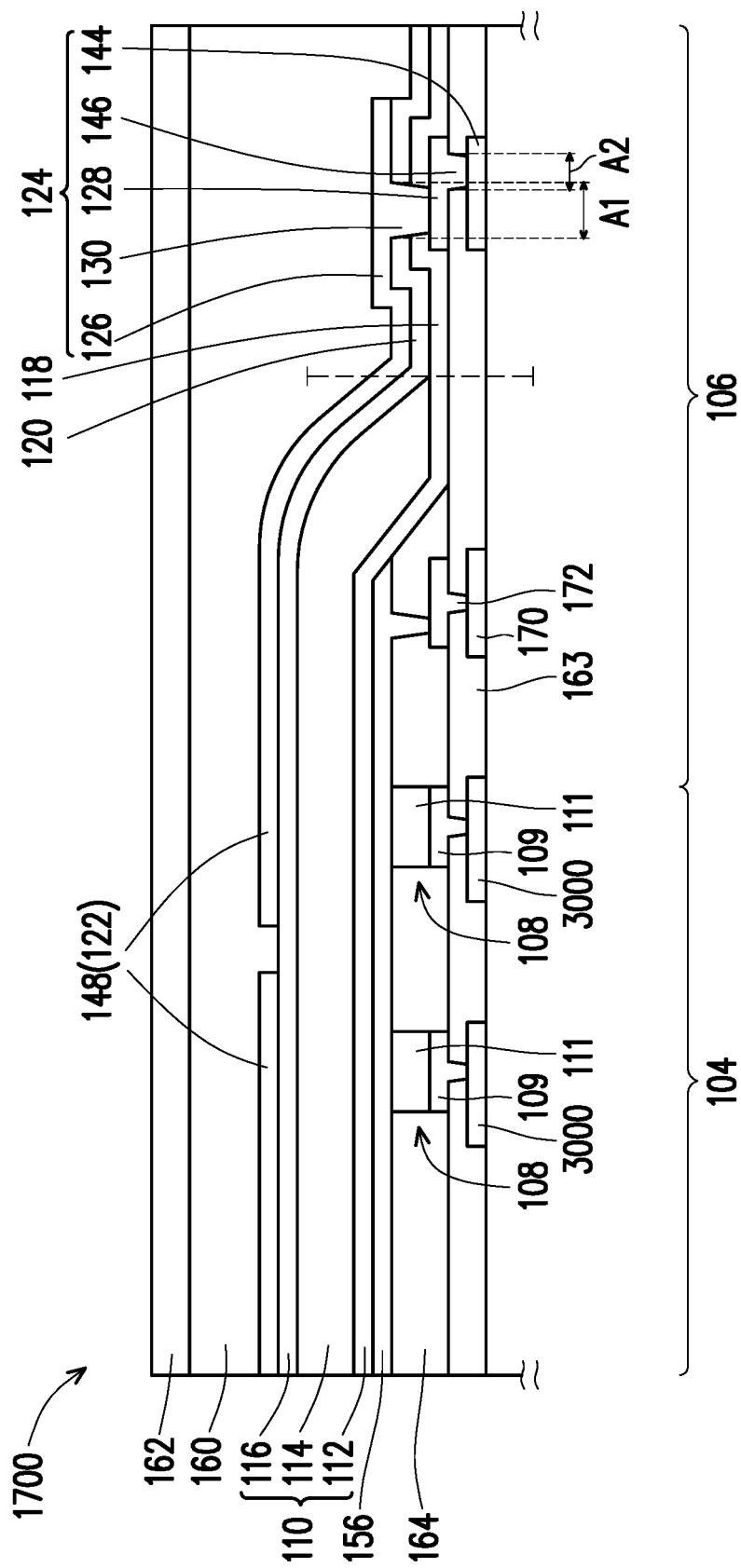
FIG. 17 is a schematic diagram showing a cross-section of an alternative example of the touch display device according to the eighth embodiment of the present disclosure.

FIG. 17 is a schematic diagram showing a cross-section of an alternative example of the touch display device according to the eighth embodiment of the present disclosure. A touch display device 1700 is different from the touch display device 1600 of the eighth embodiment of the present disclosure in that the first touch part 148 and the light-emitting layer 111 are disposed in an overlapping way, i.e., the first touch part 148 overlaps with and covers the light-emitting layer 111. The remaining structures of the touch display device 1700 may refer to the eighth embodiment of the present disclosure, and the descriptions thereof are omitted herein.

Based on the foregoing, in the touch display device of the embodiments of the present disclosure, the first insulating layer is disposed on the light-emitting component, the first touch part and the first transmission part are disposed on the first insulating layer, and the first transmission part is electrically connected to the first touch part and a processing unit for transmitting signals. According to some embodiments, the transmission parts of touch signal transmission lines on the peripheral area, the touch part, the conducting layer, or an electrode on the display area can be part of the same layer, so that the process can be simplified.

Finally, it should be remarked that the foregoing embodiments are only used to illustrate, but not limit, the technical solutions of the present disclosure; although the present disclosure is demonstrated in detail with reference to the aforementioned embodiments, those skilled in the art should understand that various modifications still can be made to the technical solutions recorded in the embodiments, or equivalent replacements can be made to parts or all of the technical features in the technical solutions; the nature of the corresponding technical solutions cannot be departed from the scope of the technical solutions of the embodiments of the present disclosure by these modifications or replacements.

What is claimed is:

1. A touch display device, comprising:
    a substrate including a display area and a peripheral area;
    a thin film transistor disposed within the display area on the substrate;
    a second insulating layer disposed on the thin film transistor within the display area;
    a light-emitting component, disposed on the second insulating layer within the display area;
    an opposite electrode disposed on a light-emitting layer of the light-emitting component;
    a first insulating layer disposed on the opposite electrode within the display area and disposed on the second insulating layer within the peripheral area;
    a touch component disposed on the first insulating layer and within the display area;
    a first transmission part disposed on the first insulating layer within the peripheral area, wherein the first transmission part is electrically connected to a first touch part of the touch component within the peripheral area;
    a first conductive connection structure penetrating through the first insulating layer; and
    a second transmission part, disposed on the second insulating layer and below the first insulating layer within the peripheral area, wherein the first transmission part is electrically connected to the second transmission part via the first conductive connection structure;
    a second conductive connection structure penetrating through the second insulating layer; and
    a third transmission part, wherein the second transmission part is electrically connected to the third transmission part via the second conductive connection structure,
    wherein the thin film transistor comprises a conducting layer disposed on a buffer layer on the substrate and within the display area, and the third transmission part is made of the same material as the conducting layer.

2. The touch display device according to claim 1, wherein at least one portion of the first transmission part and at least one portion of the second transmission part extend along an identical direction from the display area to the peripheral area.

3. The touch display device according to claim 1, wherein a first through hole penetrates through the first insulating layer, the first conductive connection structure is disposed in the first through hole, and a projection of the first through hole on the substrate is circular.

4. The touch display device according to claim 1, wherein a first through hole penetrates through the first insulating layer, the first conductive connection structure is disposed in the first through hole, a second through hole penetrates through the second insulating layer, the second conductive connection structure is disposed in the second through hole, and a projection of the first through hole on the substrate and a projection of the second through hole on the substrate are separated.

5. The touch display device according to claim 1, further comprising:
    a bridge, wherein the bridge is disposed between the first touch part and the first insulating layer.

6. The touch display device according to claim 1, wherein the first touch part and the first transmission part are of the same layer.

7. The touch display device according to claim 1, wherein the first touch part, the first transmission part, and the first conductive connection structure are of the same layer.

8. The touch display device according to claim 1, wherein the first insulating layer includes a first inorganic layer and a second inorganic layer disposed on the first inorganic layer.

9. The touch display device according to claim 6, wherein the first insulating layer further comprises an organic layer, and the organic layer is disposed between the first inorganic layer and the second inorganic layer.

* * * * *